(12) United States Patent
Ziaja et al.

(10) Patent No.: US 11,443,823 B2
(45) Date of Patent: Sep. 13, 2022

(54) METHOD AND CIRCUIT FOR SCAN DUMP OF LATCH ARRAY

(71) Applicant: SambaNova Systems, Inc., Palo Alto, CA (US)

(72) Inventors: Thomas A. Ziaja, Austin, TX (US); Uma Durairajan, San Jose, CA (US); Dinesh R. Amirtharaj, Milpitas, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/468,066

(22) Filed: Sep. 7, 2021

(65) Prior Publication Data

US 2022/0139478 A1 May 5, 2022

Related U.S. Application Data

(60) Provisional application No. 63/107,413, filed on Oct. 29, 2020.

(51) Int. Cl.
*G11C 29/32* (2006.01)
*G11C 29/42* (2006.01)
(Continued)

(52) U.S. Cl.
CPC ............ *G11C 29/32* (2013.01); *G11C 7/1039* (2013.01); *G11C 29/1201* (2013.01);
(Continued)

(58) Field of Classification Search
CPC ........ G11C 11/4082; G11C 2029/3202; G11C 29/12015; G11C 7/1051; G11C 7/22;
(Continued)

(56) References Cited

U.S. PATENT DOCUMENTS

| 3,761,695 A | 9/1973 | Eichelberger |
| 5,369,752 A | 11/1994 | Giles et al. |

(Continued)

FOREIGN PATENT DOCUMENTS

WO 2010142987 A1 12/2010

OTHER PUBLICATIONS

Prabhakar et al., "Plasticine: A Reconfigurable Architecture for Parallel Patterns", ISCA '17, Jun. 24-24, 2017, Toronto ON, Canada.
(Continued)

*Primary Examiner* — April Y Blair
*Assistant Examiner* — Sazzad Hossain
(74) *Attorney, Agent, or Firm* — Haynes Beffel & Wolfeld LLP; Sikander M. Khan; Bruce A. Young

(57) ABSTRACT

Testability of memory on integrated circuits is improved by connecting storage elements like latches in memory to scan chains and configuring memory for scan dump. The use of latches and similar compact storage elements to form scannable memory can extend the testability of high-density memory circuits on complex integrated circuits operable at high clock speeds. A scannable memory architecture includes an input buffer with active low buffer latches, and an array of active high storage latches, operated in coordination to enable incorporation of the memory into scan chains for ATPG/TT and scan dump testing modes.

20 Claims, 14 Drawing Sheets

(51) Int. Cl.
| | |
|---|---|
| *G11C 29/12* | (2006.01) |
| *G11C 7/10* | (2006.01) |
| G11C 11/408 | (2006.01) |
| G01R 31/3187 | (2006.01) |
| G01R 31/3185 | (2006.01) |
| G01R 31/3177 | (2006.01) |
| G01R 31/317 | (2006.01) |
| G06F 11/27 | (2006.01) |
| G11C 7/22 | (2006.01) |

(52) U.S. Cl.
CPC ........ *G11C 29/12015* (2013.01); *G11C 29/42* (2013.01); *G01R 31/3172* (2013.01); *G01R 31/3177* (2013.01); *G01R 31/3185* (2013.01); *G01R 31/3187* (2013.01); *G01R 31/31723* (2013.01); *G01R 31/318536* (2013.01); *G01R 31/318541* (2013.01); *G01R 31/318544* (2013.01); *G01R 31/318547* (2013.01); *G01R 31/318566* (2013.01); *G06F 11/27* (2013.01); *G11C 7/1051* (2013.01); *G11C 7/22* (2013.01); *G11C 11/4082* (2013.01); *G11C 2029/3202* (2013.01)

(58) Field of Classification Search
CPC ...... G01R 31/318536; G01R 31/31725; G01R 31/3177; G01R 31/318558; G01R 31/31727; G01R 31/31723; G01R 31/318541; G01R 31/318552; G01R 31/318572
See application file for complete search history.

(56) References Cited

U.S. PATENT DOCUMENTS

| | | | |
|---|---|---|---|
| 6,317,819 B1 | 11/2001 | Morton | |
| 6,532,337 B1* | 3/2003 | Yoshinaka | G11B 20/10 386/269 |
| 8,214,172 B2 | 7/2012 | Wang et al. | |
| 8,924,801 B2 | 12/2014 | Tekumalla et al. | |
| 9,739,833 B2 | 8/2017 | Hou et al. | |
| 10,831,507 B2 | 11/2020 | Shah et al. | |
| 2004/0123198 A1* | 6/2004 | Gschwind | G01R 31/318575 714/726 |
| 2004/0218454 A1* | 11/2004 | Gorman | G11C 29/802 365/225.7 |
| 2005/0268185 A1 | 12/2005 | Vinke et al. | |
| 2011/0239070 A1 | 9/2011 | Morrison | |
| 2013/0080847 A1 | 3/2013 | Zorian et al. | |
| 2014/0281776 A1 | 9/2014 | Champion et al. | |
| 2014/0317463 A1* | 10/2014 | Chandra | G01R 31/31723 714/729 |
| 2015/0206559 A1 | 7/2015 | Priel et al. | |
| 2015/0276874 A1 | 10/2015 | Morton | |
| 2018/0238965 A1* | 8/2018 | Anzou | G11C 29/32 |
| 2019/0204382 A1 | 7/2019 | Pradeep et al. | |
| 2020/0258590 A1 | 8/2020 | Spica | |
| 2020/0310809 A1 | 10/2020 | Hughes et al. | |

OTHER PUBLICATIONS

Seok, et al., "Write-through method for embedded memory with compression Scan-based testing," 2012 IEEE 30th VLSI Test Symposium (VTS), Apr. 23-26, 2012, pp. 158-163.

Sitchinava, Thesis: "Dynamic Scan Chains A Novel Architecture to Lower the Cost of VLSI Test," MIT, Sep. 2003, 64 pages.

Podobas et al, A Survey on Coarse-Grained Reconfigurable Architectures From a Performance Perspective, IEEEAccess, vol. 2020. 3012084, Jul. 27, 2020, 25 pages.

M. Emani et al., "Accelerating Scientific Applications With SambaNova Reconfigurable Dataflow Architecture," in Computing in Science & Engineering, vol. 23, No. 2, pp. 114-119, Mar.-Apr. 1, 2021, doi: 10.1109/MCSE.2021.3057203.

Garg et. al., LBIST—A technique for infield safety, Design&Reuse, dated Sep. 21, 2015, 4 pages.

Radhakrishnan, Design for Testability (DFT) Using SCAN, dated Sep. 1999, Issue-2, 13 pages.

Press, Thorough test means testing through the RAM, EDN, dated Sep. 17, 2012, 3 pages.

Li et. al., Logic BIST: State-of-the-Art and Open Problems, dated Mar. 16, 2015, 6 pages.

Venkataraman et. al., An experimental study of N-detect scan ATPG patterns on a processor, Proceedings of the 22nd IEEE VLSI Test Symposium (VTS 2004), dated May 2004, 7 pages.

Krishna H. V. et.al., Techniques to Improve Quality of Memory Interface Tests in SoCs Using Synopsys TetraMAX's RAM Sequential ATPG, Texas Instruments, Bangalore, India, 14 pages. Retrieved on Oct. 20, 2021. Retrieved from the internet [URL: https://pdfcoffee.com/ram-sequential-atpg-pdf-free.html ].

MacDonald, Logic BIST, EE5375 University of Texas El Paso (UTEP), dated Nov. 20, 2014, 15 pages.

Einfochips PES, Memory Testing: MBIST, BIRA & BISR | An Insight into Algorithms and Self Repair Mechanism, Einfochips, dated Dec. 11, 2019, 14 pages. Retrieved on Oct. 21, 2021. Retrieved from the internet [URL: https://www.einfochips.com/blog/memory-testing-an-insight-into-algorithms-and-self-repair-mechanism/#utm_source=rss&utm_medium=rss ].

U.S. Appl. No. 17/503,227—Office Action dated Feb. 4, 2022, 11 pages.

U.S. Appl. No. 17/503,227 Notice of Allowance dated Apr. 4, 2022, 9 pages.

U.S. Appl. No. 17/468,024—Office Action dated Jan. 18, 2022, 47 pages.

U.S. Appl. No. 17/468,024—Response to Office Action dated Jan. 18, 2022, filed Apr. 7, 2022, 11 pages.

PCT/US2021/057391—International Search Report and Written Opinion, dated Feb. 24, 2022, 14 pages.

U.S. Appl. No. 17/503,227—Response to Office Action dated Feb. 4, 2022, filed Mar. 17, 2022, 9 pages.

* cited by examiner

METHOD AND CIRCUIT FOR SCAN DUMP OF LATCH ARRAY

PRIORITY APPLICATION

This application claims the benefit of U.S. Provisional Patent Application No. 63/107,413 filed 29 Oct. 2020, which application is incorporated herein by reference.

FIELD OF THE TECHNOLOGY

The present technology relates to the field of integrated circuits including memory designed for testability and diagnostics including, in some embodiments, scan chain compatible memory testable using one or more of automatic test pattern generation (ATPG), transition testing (TT) and memory built-in self-test (BIST).

BACKGROUND

Integrated circuits include various types of on-chip memory circuits. Examples of such memory circuits which can be used in critical processing paths are known by such names as working memory, cache, buffers, registers, First-In-First-Out buffers (FIFOs), Look-Up-Tables (LUTs), Least Recently Used (LRU) buffers, and various types of queues. In many settings, memory circuits must be stable and fast, and can occupy significant area on a chip.

Integrated circuits often incorporate structures to support testing of the circuits on the devices, using Design for Testability (DFT) techniques. One aspect of such techniques includes implementation of scan chains on the integrated circuit, which connect flip-flops and registers used in the functional circuit, to form a serial chain parallel to the functional circuit paths of the device. Data patterns can be loaded in the chip using the scan chain, the functional circuits can be exercised, and then the resulting pattern read out using the scan chain for analysis. An early example of such a technique is a scan design known as Level Sensitive Scan Design (LSSD) described in U.S. Pat. No. 3,761,695 to Eichelberger.

It is desirable to provide technologies for efficient integrated circuit memory with improved testability.

SUMMARY

Technologies are described herein which improve the testability of memory on integrated circuits supporting, in various embodiments, connecting storage elements like latches in memory to scan chains and configuring memory for scan dump. The use of latches and similar compact storage elements to form scannable memory can extend the testability of high-density memory circuits on complex integrated circuits operable at high clock speeds.

A scannable memory circuit is described for implementation on an integrated circuit having a scan chain, in one aspect of the technology herein, in which the memory is composed of an array of storage elements, such storage latches, having a plurality of rows and a plurality of columns. Also, the circuit includes an input buffer connected to the array of storage elements, including a row of buffer latches enabled to load data during a first part of an input clock signal, such as having active low enable inputs connected to the input clock. The storage elements in the array are enabled to load data during a second part of an input clock signal, such as by having active high enable signals coupled to a row clock signal synchronized with the input clock. The row of buffer latches is configured to transfer data during the second part of the input clock signal from the input buffer to storage elements of a selected row in the plurality of rows in parallel. The memory circuit in this aspect of the technology includes an output selector connected to the array of storage elements having inputs connected to the storage elements in the array of storage elements, to output data from storage elements in a selected row in parallel to an output bus having lines DOUT[N-1:0]. To support inserting storage elements in the array in a scan chain, an input data selector having an output DIN[N-1:0] is connected to the row of buffer latches in the input buffer and selects, in dependence on a scan enable signal, from a first input connected to a functional path data, and a second input connected to a scan mode input bus. The scan mode input bus has a scan-in line connected to the scan chain for connection to DIN[N-1] and a plurality of feedback lines for output data DOUT[N-1:1] from storage elements in the selected row for connection to DIN[N-2:0], respectively. Also, the memory circuit includes a circuit, responsive to the scan enable signal to connect output data DOUT[0] to a scan-out line connected to the scan chain.

To support testing such as automatic test pattern generator ATPG scan tests and transition testing using ATPG, a control circuit can be included to provide the scan enable signal, and to set a row address to the selected row during a scan operation shifting data from the scan-in line through the selected row to the scan-out line. The control circuit can be configured to execute a procedure including: setting the row of input selectors to a scan mode; setting the row enable signal to a fixed row in the scan mode; sequentially while in a scan mode, loading during the first part of the clock period a bit from the scan chain in the first buffer latch of the input row and a bit from the output line of the next adjacent column in the other latches in the input row, and writing during the second part of the clock period the bits in the input row of latches to the storage elements in the fixed row in the corresponding columns; and applying the line on the output bus corresponding to the last column of the array to a scan-out line.

A scannable memory circuit is described for implementation on an integrated circuit having a scan chain configured for scan dump (a scan dump chain), in one aspect of the technology herein, in which the memory is composed of an array of storage elements having a plurality of rows and a plurality of columns. An input buffer in this aspect of the technology is connected to the array of storage elements, including a row of buffer latches enabled to load data during a first part of an input clock signal, and configured to transfer data during a second part of the input clock signal from the input buffer to storage elements of a selected row in the plurality of rows in parallel. An output selector is connected to the array of storage elements having inputs connected to the storage elements in the array of storage elements, to output data from storage elements in a selected row in parallel to an output bus having lines DOUT[N-1:0]. An input data selector having an output DIN[N-1:0] connected to the row of buffer latches in the input buffer selects, in dependence on a scan dump signal, from a first input connected to a functional path data, and a second input connected to a scan dump input bus, the scan dump input bus having a plurality of feedback lines for output data DOUT[N-1:1] from storage elements in the selected row for connection to DIN[N-2:0], respectively. The line of the scan dump input bus for connection to DIN[N-1] can be disconnected or connected to a reference node in some cases, or in other cases connected to a scan dump in line to receive scan dump data from other circuits on the device. A circuit is provided, responsive to the scan dump signal, to connect output data DOUT[0] to a scan-out line connected to the scan dump chain.

To support testing operations including scan dump, a control circuit to provide the scan dump signal, and increment the selected row during a scan dump operation. As a result, the scan dump operations shifts data from the plurality of rows in sequence to the scan-dump out line. The control circuit can be configured to execute a procedure including: setting the row of input selectors to a scan mode; sequentially while the input clock is running in a scan dump mode, loading during the first part of the clock period a bit from the scan chain in a first buffer latch of the input row and a bit from the output line of the next adjacent column in the other buffer latches in the input row, and writing during a second part of the clock period the bits in the input row of buffer latches to the storage elements in a selected row in the corresponding columns; incrementing the row enable signals while the input clock is running in the scan dump mode by one row after a number of input clock periods equal to the number of columns of the array; and applying a line on the output bus corresponding to the last column of the array to a scan-out line.

These and other features, aspects, and advantages of the technology disclosed will become apparent from the following detailed description and the accompanying drawings.

BRIEF DESCRIPTION OF THE DRAWINGS

In the drawings, like reference characters generally refer to like parts throughout the different views. In the following description, various implementations of the technology disclosed are described with reference to the following drawings.

DETAILED DESCRIPTION

The following discussion is to enable any person skilled in the art to make and use the technology disclosed. Various modifications to the disclosed implementations will be clear to those skilled in the art, and the general principles defined can apply to other implementations and applications without departing from the spirit and scope of the technology disclosed. Thus, the technology disclosed is not limiting to the implementations shown but is to be accorded the widest scope consistent with the principles and features disclosed.

Figure 1:
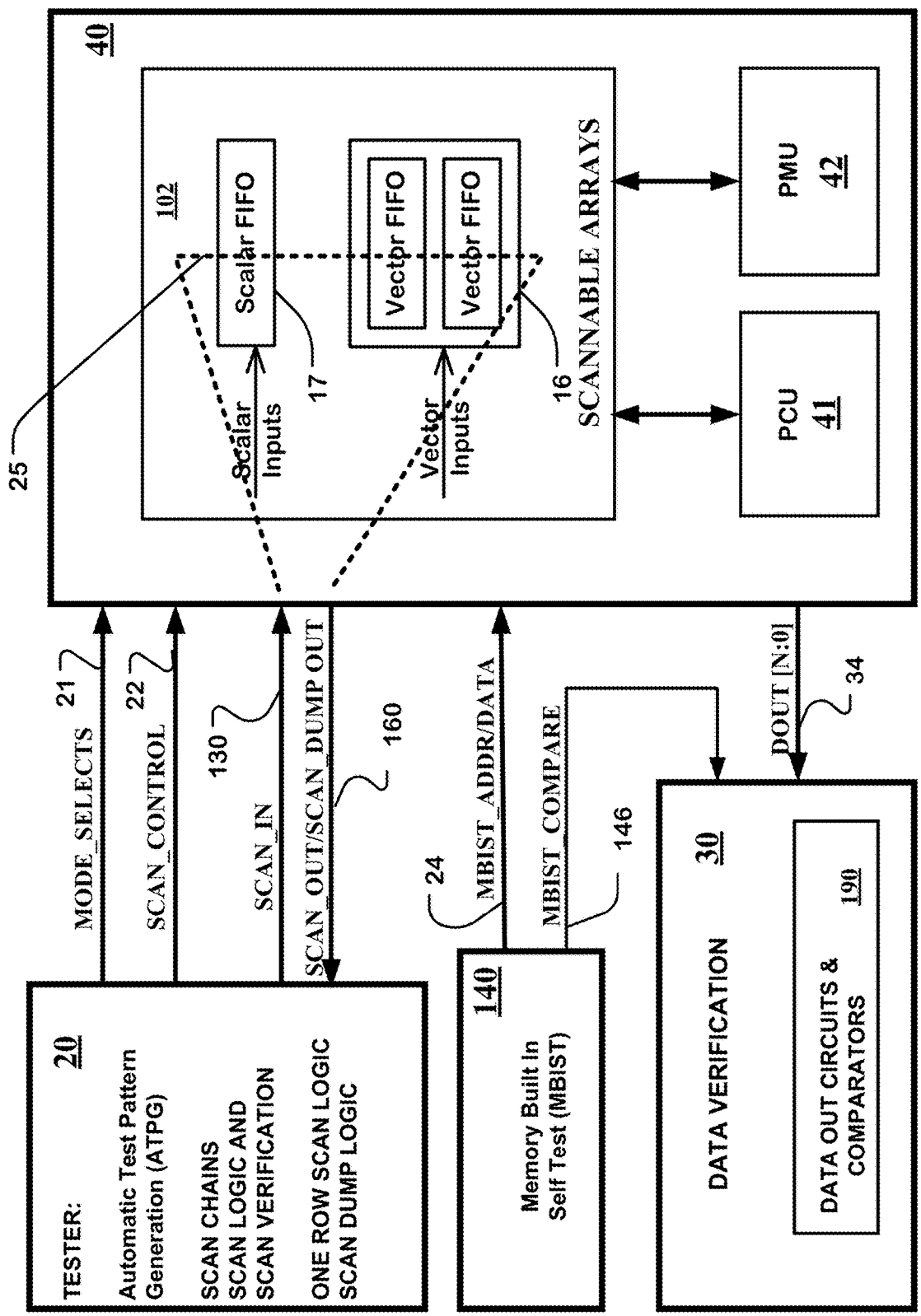
FIG. 1 is a system diagram illustrating a scan chain and scan dump tester, MBIST data verification and an example reconfigurable processor.

FIG. 1 is heuristic diagram of a data processing system including a tester 20, a memory built-in self-test MBIST module 140, a data verification module 30 included as part of, or coupled to, an integrated circuit 40 which includes one or more scannable storage element arrays 102. As illustrated, the circuit 40 can include scannable storage element arrays configured as scalar FIFOs 17 and Vector FIFOs 16. Other types of memory can be included on the integrated circuit, implemented using scannable storage element arrays as described herein. In this example, the integrated circuit 40 comprises a reconfigurable processor (RP) having an array of reconfigurable units (e.g., PCU 41, PMU 42), the units including or being coupled to the scannable storage element arrays 102 for various purposes. In one embodiment, the integrated circuit comprises a coarse grain reconfigurable array (CGRA) of reconfigurable units, such as described in Prabhakar et al., "Plasticine: A Reconfigurable Architecture for Parallel Patterns," ISCA '17, Jun. 24-28, 2017, Toronto, ON, Canada, which is incorporated by reference as if fully set forth herein. Scannable storage element arrays as described herein can be part of any type of integrated circuit, such as a microprocessor, a digital signal processor, a microcontroller, an application-specific integrated circuit (ASIC), a communications device, a memory controller, a field programmable gate array (FPGA), or the like.

The Tester 20 comprises an automatic test pattern generator (ATPG), transition testing (TT), scan dump and scan chain interfaces, scan logic and scan verification. The Tester outputs MODE_SELECTS 21 to choose between the functional mode, the MBIST mode, scan dump mode and the ATPG/TT scan modes. A SCAN_IN line 130 injects serial test data to a scan chain on the integrated circuit 40. The SCAN_CONTROL 22 is a bus comprising the scan shift clock. The SCAN_OUT/SCAN_DUMP OUT line 160 is the data output after traversing the scan chains in the RP. The MBIST 140 outputs MBIST_ADDR/DATA (line 24) which comprise the address, data, and enable lines to test the Latch Array rows. The MBIST 140 also outputs the MBIST_COMPARE 146 vectors to the Data Verification module 30. The Data Verification module 30 contains the Data Out Circuits and Comparators 190 whose first input is the vector DOUT[N:0] 34 which must compare with MBIST_COMPARE 146 vectors. The DOUT[N:0] 34 is the output generated by the MBIST controller. In some embodiments, the MBIST 140 and Data Verification module 30 are embedded within the example integrated circuit 40 block.

As described herein, some or all memory implemented using scannable storage element arrays on the integrated circuit are incorporated in one or more scan chains as represented by line 25 (and/or scan dump chains which can be scan chains configured to support scan dump), and testable using at least one of the tester 20, Memory Built In Self Test MBIST module 140 and data verification module 30, and some or all memory implemented using storage element arrays on the integrated circuit can be written with data from line 24 and output data on line 34 for use with the MBIST unit 140.

Figure 2:
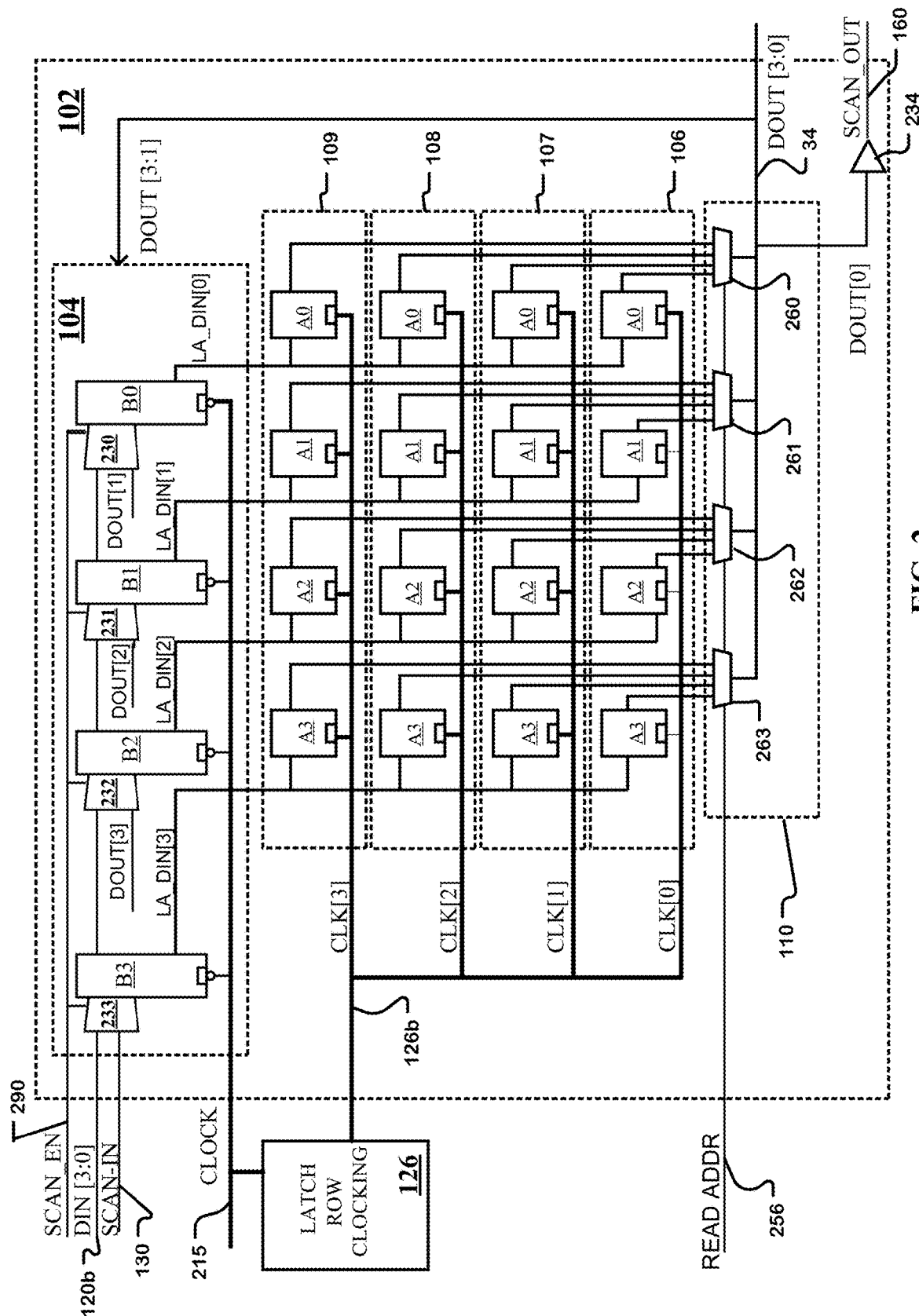
FIG. 2 depicts an example four-row, four column scannable latch array.

FIG. 2 is schematic diagram of an implementation of a scannable storage element array in which the storage elements are latches. The array of FIG. 2 includes four rows by four columns (4×4) of latches. The scannable array comprises one row 104 of "B" latches B0 to B3 ("buffer latches"), and four "A" latch rows, a row 106 of "A" latches ("storage latches"), a row 107 of "A" latches, a row 108 of "A" latches, a row 109 of "A" latches. The "B" latches in this example are enabled "active low" in response to the clock on line 215, and latch input data from the corresponding multiplexer during the interval when the clock on line 215 is low. The "A" latches in this example are enabled "active high" in response to the corresponding row clock on line 126b, and latch respective bits of input data LA_DIN [3:0] from "B" latches in respective columns during the interval when the corresponding row clock on line 126b is high.

The "A" and "B" latches are storage elements having enable inputs which pass their input data to their output when the enable signal is asserted, and hold the last value of the input data when the enable signal is de-asserted. Because they pass their input data to their output when the enable signal asserted, they can be referred to as transparent latches. As a result, their output is not necessarily stable during the time that the enable signal is asserted, and depends on the fluctuations of the input signals in that enabled interval.

The "A" and "B" latches in scannable latch array of FIG. 2 can be implemented using D-latches or other storage element circuits, with active high and active low enable inputs, respectively. In this example, the enable input to the each of the "B" latches is active low, and so the "B" latch is enabled when the CLOCK signal is low (a "second part of the clock period"), and holds the data value on its input at the end of the low phase of the clock during the time that the CLOCK signal is high (a "first part of the clock period"), that is during the high phase of the CLOCK signal. Also in this example, the enable input to each of the "A" latches is active high, and so the "A" latch is enabled when the corresponding row clock signal (e.g. CLK[0]) is high, and holds the data value on its input at the end of the high phase of the corresponding row clock signal (e.g. CLK[0]), that is during the high phase of the corresponding row clock signal (e.g. CLK[0]).

In this embodiment, the CLOCK signal and the row clock signals (e.g. CLK[0]), are synchronized, meaning herein that the high and low phases are aligned sufficiently for this operation to operate without unacceptable glitches. So the "B" latch captures an input value at the end of the low phase of the CLOCK signal, which corresponds with the end of the low phase of the row clock signals, and holds the captured input value during the high phase of row clock signals which corresponds to the high phase of the CLOCK signal. This relationship establishes a master-slave flip-flop operation, in which the "B" latch is a master latch for a corresponding column of "A" latches, and the "A" latch of a selected row is the slave latch. The "A" latch in a selected row therefore latches new data at the rising edge of the row clock signal. Because the master "B" latch is holding its data during the high phase of the CLOCK signal, and the slave "A" latch changes only during the high phase of the row clock signal, any changes in data in the latch array are synchronized the leading edge of the row clock signal.

More generally, the "B" latches are enabled in a first part of a clock period of a scan clock, and the "A" latches are enabled in a second part of the clock period, so that data is captured in the "A" latch on transition from the first part to the second part of the clock period. Data read from the latches is stable during the second part of the clock period. For example, in an alternate embodiment, the "B" latches can be active high, and the "A" latches can be active low.

An "A" latch in the latch array can be incorporated into a scan chain that utilizes this master-slave operation. The use of transparent latches in the array ("A" latches) results in substantial saving of area because the circuits to implement them are smaller than circuits for flip-flops. The configuration described herein however, provides the ability to include storage elements in the array in a scan chain, and to support other testing methodologies.

In the row 104 of "B" latches, input multiplexers 230-233 are connected to the inputs of respective "B" latches B0-B3, and have control inputs connected to a scan enable signal SCAN_EN on line 290. The outputs of the input multiplexers 230-233 collectively provide a scan mode input bus and/or a scan dump input bus (not separately shown in the figure). Input multiplexer 233 has its output connected to the input of "B" latch B3. A first input of the input multiplexer 233 is a corresponding line from the data in bus 120b, carrying bit 3 of the data DIN[3:0], and a second input of the input multiplexer 233 is a SCAN-IN signal received from a scan chain.

Input multiplexer 232 has its output connected to the input of "B" latch B2. A first input of the input multiplexer 232 is a corresponding line from the data in bus 120b, carrying bit 2 of the data DIN[3:0], and a second input of the input multiplexer 232 is a corresponding line from a data out bus 34, carrying bit 3 of the data signal DOUT[3:0].

Input multiplexer 231 has its output connected to the input of "B" latch B1. A first input of the input multiplexer 231 is a corresponding line from the data in bus 120b, carrying bit 1 of the data DIN[3:0], and a second input of the input multiplexer 232 is a corresponding line from a data out bus 34, carrying bit 2 of the data signal DOUT[3:0].

Input multiplexer 230 has its output connected to the input of "B" latch B0. A first input of the input multiplexer 230 is a corresponding line from the data in bus 120b, carrying bit 0 of the data DIN[3:0], and a second input of the input multiplexer 230 is a corresponding line from a data out bus 34, carrying bit 1 of the data signal DOUT[3:0].

A first mode of operation is the functional mode in which the multiplexers 230 to 233 connect corresponding lines of the input bus carrying DIN[3:0] to the inputs of latches B3 to B0. A second mode of operation is the scan mode, where the multiplexer 233 connects SCAN-IN on line 130 to the input of latch B3, the multiplexer 232 connects DOUT[3] from bus 34 to the input of latch B2; the multiplexer 231 connects DOUT[2] from bus 34 to the input of latch B1; and the multiplexer 230 connects DOUT[1] from bus 34 to the input of latch B0. During an MBIST mode, the input bus carrying DIN[3:0] can carry the MBIST input data.

Also, included is an "A" latch row clocking circuit 126. The latch row clocking circuit 126 receives the clock on line 215, and row select signals (e.g., addresses) not shown, and applies the clock signal from line 215 to a selected row. In some embodiments, the clock signals applied on the selected rows can be generated from alternate sources, so long at the operative timing is correct.

Also, are "A" latch row select multiplexers 260 to 263 (in group 110) having inputs connected to the outputs of one "A" latch in each row in respective columns of the array. The control signal READ-ADDR on line 256 is connected to "A" latch row multiplexers 110 and selects an "A" latch row to couple onto DOUT[3:0] 34.

During a write operation for both functional and scan modes, the selected one of the inputs SCAN-IN or DIN[3] for multiplexer 233 is input to the corresponding "B" latch, B3. The B3 latch will output LA-DIN[3] to a first column of "A3" latches. Decoding a physical address causes latch row clocking circuit 126 to provide a valid row clock for the A3 latch of the selected "A" latch row, the A3 latch of the selected row captures the data while the row clock is high. In this example, there are four row clocks for the four "A" latch rows.

Similarly, during a write operation for both functional and scan modes, the selected one of the inputs DOUT[3] or DIN[2] for multiplexer 232 is input to "B" latch, B2. The B2 "B" latch will output LA-DIN[2] to a second column of "A2" latches, and the A2 latch of selected the row captures the data while the row clock is high.

Similarly, during a write operation for both functional and scan modes, the selected one of the inputs DOUT[2] or DIN[1] for multiplexer 231 is input to "B" latch, B1. The B1 "B" latch data will output LA-DIN[1] to a third column of "A1" latches, and the A1 latch of the selected row captures the data while the row clock is high.

Similarly, during a write operation for both functional and scan modes, the selected one of the inputs DOUT[1] or DIN[0] for multiplexer 230 are input to "B" latch, B0. The B0 "B" latch data will output LA-DIN[0] to a fourth column of "A0" latches, and the A0 latch of the selected row captures the data while the row clock is high.

For a write operation in the functional mode, the latch array can store input vectors in parallel. In the example illustrated, the input vector is four bits DIN[3:0] received from a functional data path in the integrated circuit. In other embodiments, the input vector can have any width, such as eight bits, 16 bits, 32 bits, 128 bits, and so on. In a one cycle write of an input vector DIN[3:0], the bits of input data DIN[3:0] on the bus 120b are captured in parallel in the "B" latches B3 to B0 while the clock signal on line 215 is low, and held while the clock signal is high. While the row clock signal on line 126b of the selected row, e.g. CLK[0], is high, the data bits captured during the low phase and held during the high phase of the input clock signal on line 215 in the "B" latches B3 to B0 are captured in parallel in the corresponding "A" latches A3 to A0 of the selected row, and passed through to the multiplexers 263-262 and the output data bus 34 as bits DOUT[3:0]. The "B" latches B3 to B0 hold the data bits received at their respective inputs at the end of the high phase of the row clock while the corresponding row clock is low. In this example, the input clock on line 215 and the row clocks on lines 126b are synchronized, meaning herein that the high and low phases are aligned sufficiently for this operation to operate without unacceptable glitches.

In the scan modes, input data captured while the input clock is low includes four bits: the SCAN-IN bit from a scan chain in latch B3, DOUT[3] in latch B2 to shift the data from latch B3 to latch B2, DOUT[2] in latch B1 to shift select data from latch B2 to latch B1, and DOUT[1] in latch B0 to shift the data from latch B1 to latch B0. While the row clock signal on line 126b of the selected row, e.g. CLK[0], is high, the data bits captured during the low phase and held during the high phase of the input clock signal on line 215 in the "B" latches B3 to B0 are captured in parallel in the corresponding "A" latches A3 to A0 of the selected row, and passed through to the multiplexers 263-262 and the output data bus 34 as bits DOUT[3:0]. The bit DOUT[0] from the last column of the latch array is the SCAN_OUT bit for the latch array, and is fed to the scan chain SCAN_OUT line 160 through a buffer 234, in this example. This feedback from the output bus DOUT[3:0] shifted by one position implements a serial shift data path through the latch array, which is inserted into the scan chain of the integrated circuit.

Generally, the circuit of FIG. 2 is an example of a memory circuit in which the input row includes a number N of latches B(n), the input bus includes the number N of input bus lines DIN(n), and the output bus includes the number N of output bus lines DOUT(n), where N is the number of columns of the array. Also, the first input of the input selector connected to the data input of latch B(n) is connected to input bus line DIN(n), for n going for 0 to N—1, and the second input of the input selector connected to the data input of latch B(n) in the input row other than the first latch is connected to output bus line DOUT(n+1), for n going from 0 to N−2, that is to a next adjacent column in the array. The variable N can be any practical positive integer. The number N in this example corresponds with the number of columns in the array. Although in the examples illustrated, N is a power of 2, there can be any number of columns. Other implementations include numbers columns that are not powers of 2, and odd numbers of columns. Also, in the illustrated example the number of rows is a power of 2, there can be any number of rows. Other implementations include numbers of rows that are not powers of 2, and odd numbers of rows.

In another embodiment, the storage elements implemented using the "A" latches in the array of FIG. 2 can be implemented using SRAM bit cells, typically six transistor cells including opposing inverters and pass gates connecting the opposing inverter inputs to true and complement terminals of the cells, which are connected to corresponding true and complement bit lines. The bit lines in a scannable storage element array as described herein can be shared by the bit cells in each column. Sense amplifiers are coupled to the true and complement bit lines, which provide output data for a selected bit cell in the corresponding column. In this case, the multiplexers 260 to 263 can be replaced by the sense amplifiers for the corresponding columns of cells. Also, the LA_DIN[3:0] lines can be differential signals applied to the true and complement bit lines. The row clocks CLK[3:0] are applied to the word lines which connect to enable inputs of pass gates of the bit cells in corresponding rows. An SRAM bit cell can be implemented so that it is enabled when the word line signal is high (a second part of the clock period), and holds data while the word line signal is low (a first part of the clock period). In this functional sense, it is like a transparent latch and can be used for implantation of scannable arrays as described herein.

Figure 3:
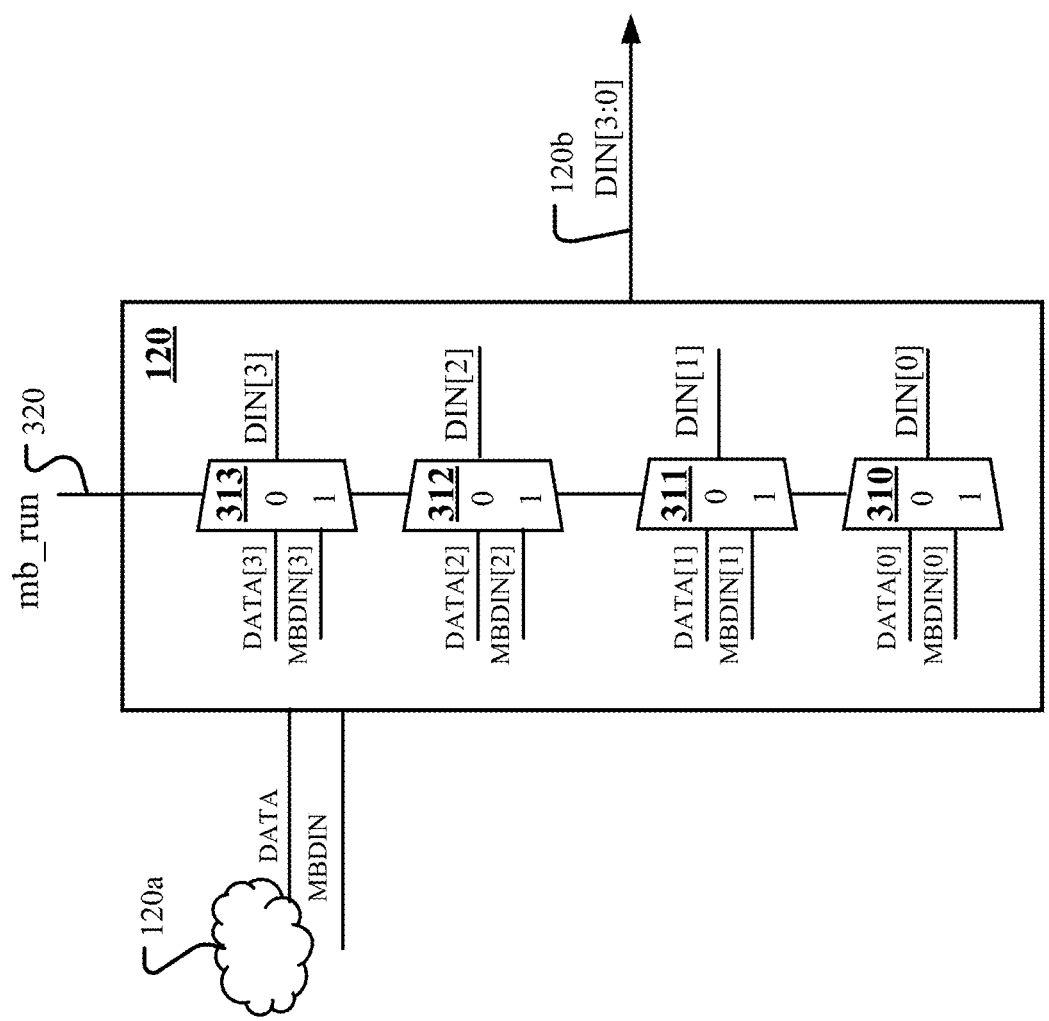
FIG. 3 illustrates an example data bus multiplexer interposed between a memory built-in self-testing (MBIST) and a Latch Array.

FIG. 3 is an example schematic illustrating a DIN[3:0] data path comprising data multiplexer block 120. The control MB_RUN on line 320 is a selector input to the data multiplexer block 120, which selects between memory built-in self-test data MBDIN (such as MIST DATA on line 24 of FIG. 1) and DATA from the functional circuitry represented by cloud 120a. In this example, the multiplexer block 120 comprises four multiplexers 310-313. When the MBIST function is running the signal MB_RUN on line 320 causes the multiplexers 310-313 to select data MBDIN. When the MBIST function is not running, the signal MB_RUN on line 320 causes the multiplexers 310-313 to select data DATA.

The data multiplexer block 120 outputs DIN[3:0] on bus 120b which is applied to the multiplexers 263-260 of FIG. 2.

Figure 4:
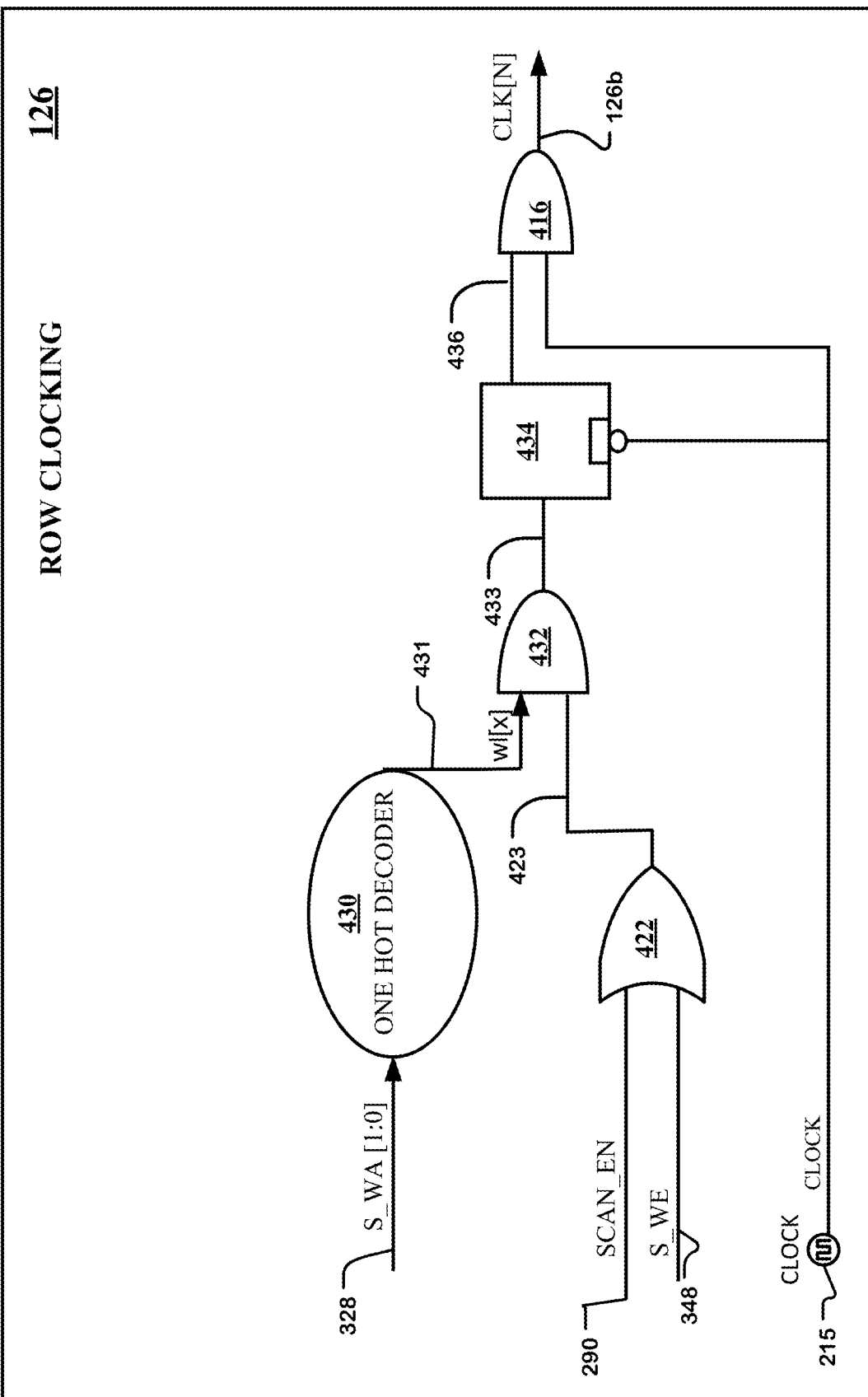
FIG. 4 illustrates an example storage latch array row clocking circuit.

FIG. 4 is an example schematic illustrating an implementation of an array row clocking circuit 126 block suitable for use in the circuit shown in FIG. 2. This example schematic is an implementation of a clocking circuit that provides a decoded clock for each row. Referring to the details of the schematic, the output of the AND gate 416 is a row clock CLK[N] on line 126b of CLK[3:0] shown in FIG. 2. The address S_WA[1:0] 328 are input to a decoder 430 (e.g. a one hot decoder) for row selection in the functional write mode. Control signals SCAN_EN 290 and S_WE 348 are inputs to an OR gate 422. The AND gate 432 receives a first input 423 from the output of the OR gate 422 and a second input 431 from the decoder 430 to provide a data input 433 to active low latch 434, which is clocked by the input clock on line 215 (or other synchronized clock), which is a scan clock in the scan modes and a functional clock in the MBIST and functional modes. The clock 215 and "B" latch 434 Q output 436 are input to the AND gate 416 to produce the corresponding row clock on line 126b. Thus, the row address in the latch array is captured at the same time (e.g. low phase of the input clock on line 215) as the input data is latched in the "B" latch row of the latch array, and stable during the access to the selected row. Similar circuits can be used to produce the row select signals in response to read enable RA signals.

Figure 5:
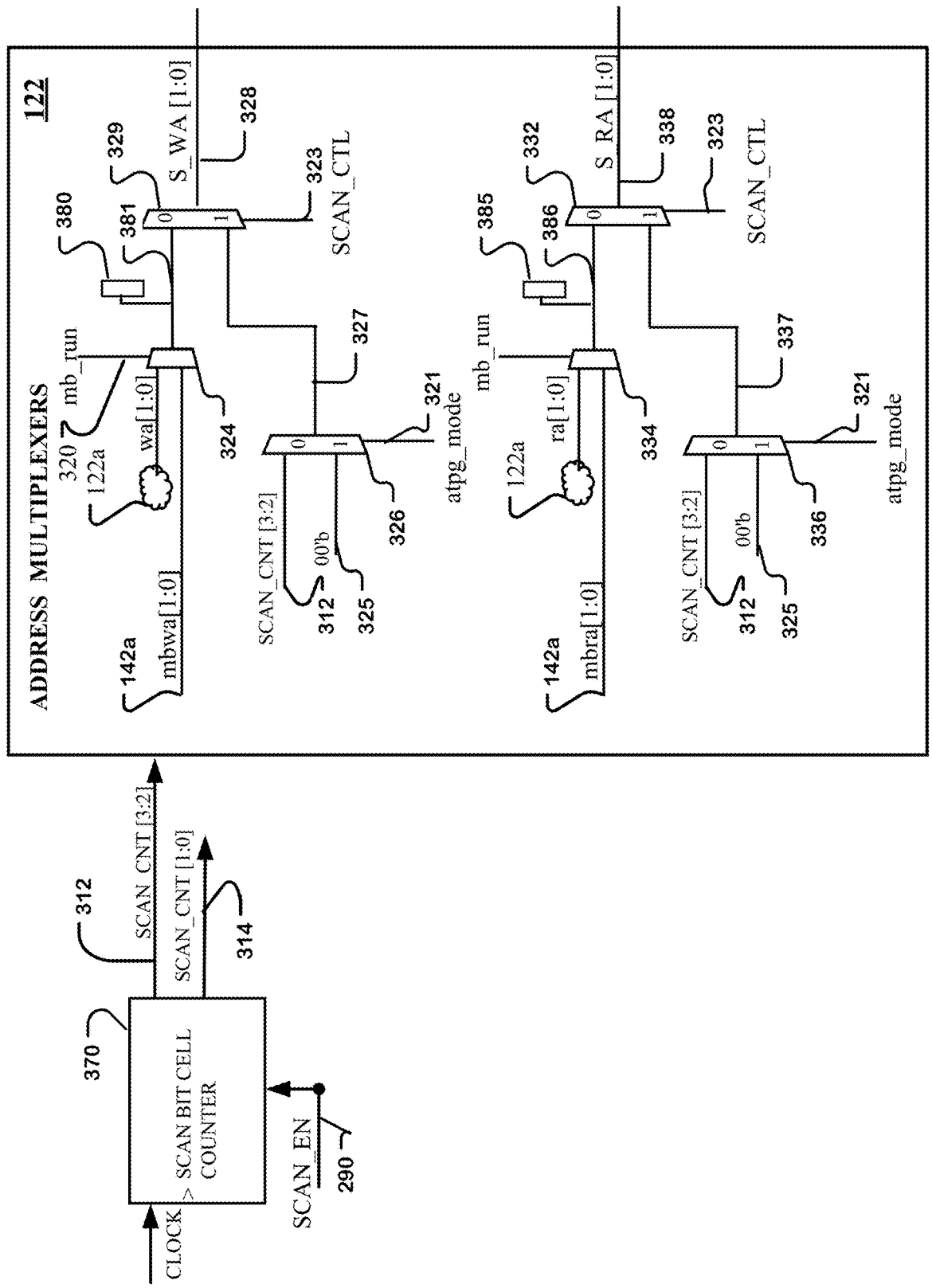
FIG. 5 shows example address multiplexers for selecting rows in the array in a plurality of modes.

FIG. 5 is an example schematic showing an implementation of an address multiplexer circuit 122 supporting four modes of operation of the latch array, applying addresses for accessing the array. The first mode is the functional mode used in operation of the array. The second mode is a memory built-in self-test mode. The third mode is a scan dump mode, and the fourth mode is the scan mode usable for ATPG/TT and similar testing. The address multiplexer circuit 122 selects between the functional address bus, the MBIST generated address bus, the scan dump generated address bus, and the ATPG one-row row-0 mode. This example implementation shows two address scan multiplexer circuits; one multiplexer circuit is for write addresses, and one multiplexer circuit is for read addresses.

According to one embodiment, the example write address multiplexer has an output multiplexer 329 operative to output the write address S_WA[1:0] on line 328 for supply to the row clock circuit of FIG. 4, and to output the read address S_RA[1:0] on line 338, for generation of the read address controlling the output multiplexers 260-263 of FIG. 2. The first output multiplexer 329 receives inputs 381 from a second multiplexer 324 and input 327 from a third multiplexer 326. The output multiplexer 329 output uses SCAN_CTL 323 to determine modes of operation and to select which address to output. The second multiplexer 324 selects between the functional input write address wa[1:0] from logic 122a and MBIST generated write address mbwa [1:0] from line 142a, and is controlled by the MB_RUN control signal on line 320. The third multiplexer 326 selects between the scan counter address values, SCAN_CNT[3:2] on line 312, generated for the Scan Dump mode or a fixed value for the scan row mode using the ATPG_MODE control signal on line 321. In this example, the scan row is set for row "0" in the ATPG_MODE which is 00'b binary.

The example read address multiplexer has an output multiplexer 332 operative to output the read address S_RA [1:0] on line 338. The output multiplexer 332 has an input 386 from a second multiplexer 334 and an input 337 from a third multiplexer 336. The output multiplexer 332 uses SCAN_CTL 323 to determine modes of operation and to select which address to output. The second multiplexer 334 selects between the functional input read address ra[1:0] and MBIST generated read address mbra[1:0] using the MB_RUN 320 control. The third multiplexer 336 selects between the scan counter address values, SCAN_CNT[3:2] on line 312, which are generated by the scan bit-cell counter 370 for the Scan Dump mode or a fixed value for the scan row mode using the ATPG_MODE 321 control. In this example, the scan row is set to 0, which is 00'b binary. Scan Dump mode uses the scan bit-cell counter 370 and will start counting when the SCAN_EN 290 control is high.

A scan bit-cell counter 370 provides for the Scan Dump mode to strobe row addresses in sequence to dump out the data in the array via the scan chain. A clock is input to increment the counter, a SCAN_EN 290 control will start the counter and the counter outputs are SCAN_CNT[3:2] on line 314 and SCAN_CNT[1:0] on line 312.

In this example, observation registers 380 and 385 capture addresses generated by the address selector. The observation registers 380, 385 are part of a scan chain (not shown) which samples combinatorial logic outputs from multiplexers 324 and 334, which output read/write addresses into the scan chain produced by the functional circuit on the device, or by the MBIST module. The observation registers capture the functional read/write addresses from lines 122a and 142a input to the multiplexers 324 and 334 so that the logic generating the addresses can be evaluated using the scan chain in ATPG/TT scan modes.

Figure 6:
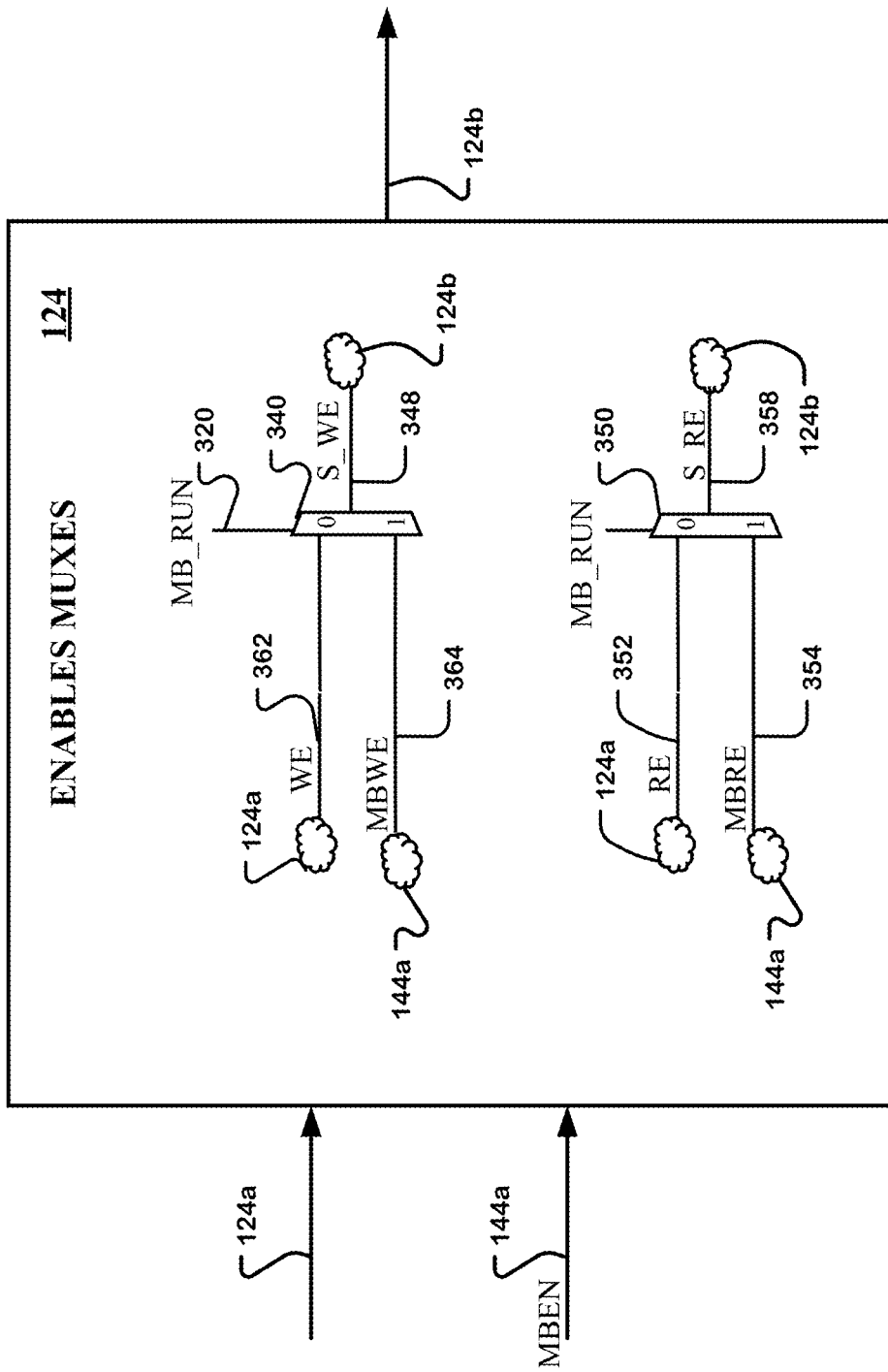
FIG. 6 shows example multiplexers for providing write enable and read enable signals in a plurality of modes.

FIG. 6 is an example schematic that shows an example enable signal multiplexer 124 for the enable bus applied as input to the row clock circuit, such as that shown in FIG. 4, for the latch array. An enable scan multiplexer selects between the two inputs, functional read/write enable signal 124a and MBIST generated enable signal 144a. The output of the multiplexers is an enable signal bus represented by 124b. One multiplexer is operative for each read enable and write enable circuit. The multiplexer 340 selects between the functional write enable 362 and the MBIST generated write enable 364 using MB_RUN 320. The multiplexer 350 selects between the functional read enable 352 and the MBIST generated read enable 354 using MB_RUN 320.

Figure 7:
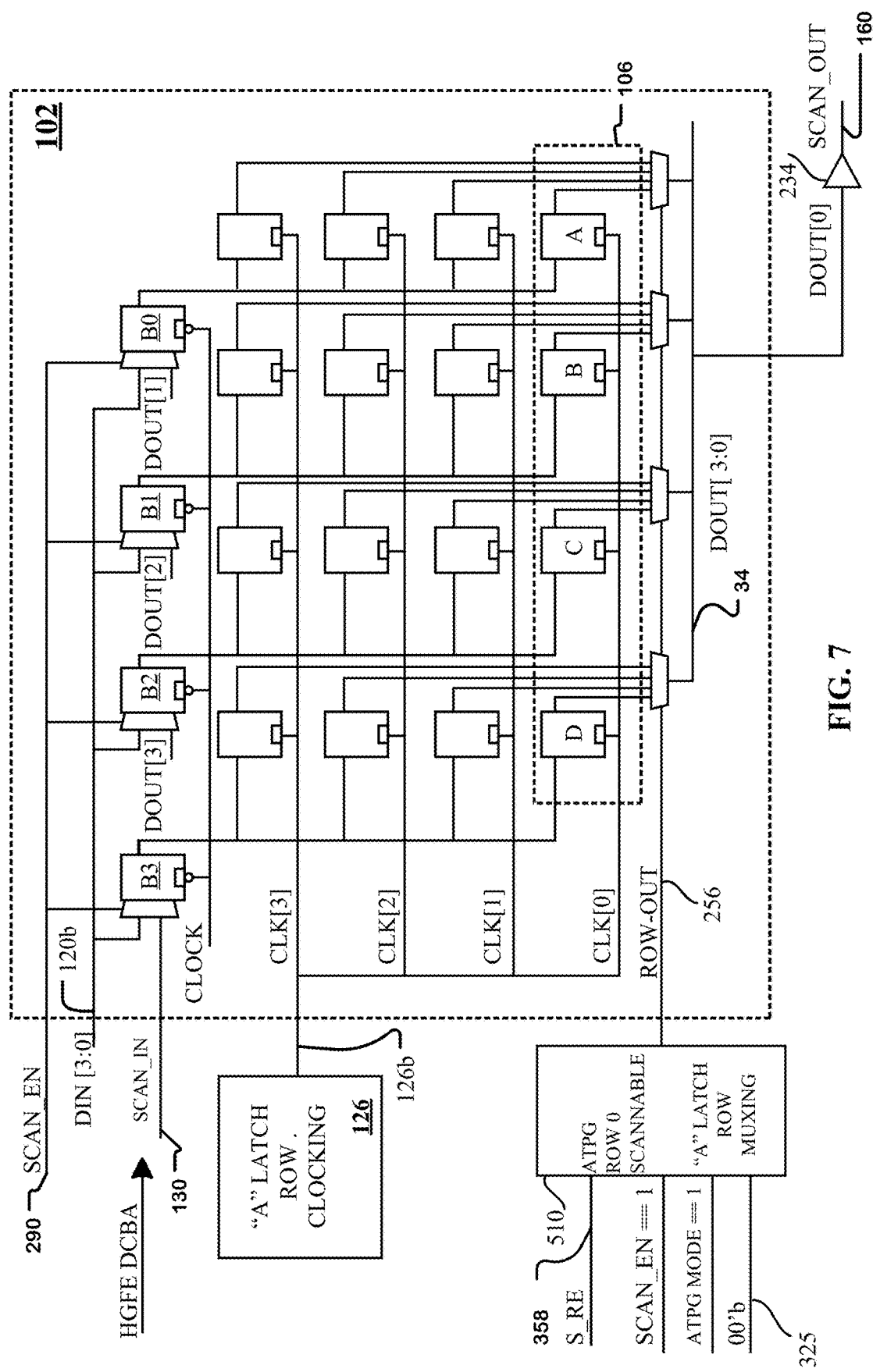
FIG. 7 depicts a Latch Array in the ATPG row "0" scannable mode using "A" latch row multiplexers.

FIG. 7 is an example schematic depicting a scannable Latch Array 102 like that of FIG. 2, having a size 4×4 structure in the ATPG row "0" scannable mode. The ATPG row "0" scannable mode is active when inputs to the control block 510 SCAN_EN equals 1, ATPG MODE 321 equals 1, S_RE 358 is active and row 00'b 325 is set. In this mode, block 510 outputs a ROW_OUT control signal on line 256 operative to enable the row multiplexers row "0" data.

FIG. 7 shows an input pattern HGFE DCBA on the SCAN_IN line 130, which depicts abstractions of data, where ABCD, etc. are labels for a specific bit in the stream of bits going in. So, the letter A represents a bit having one of a binary 0 or binary 1 value at a specific location in the bit stream, as a way of showing the progression of that specific bit. The same is true for all the bits HGFE DCBA. For clarity, we use letter symbols rather than the binary values as way to track progression of that specific bit in the scan chain.

FIG. 7 shows ROW-0 106 after four scan cycles written with data ABCD, with letter "A" is in the A0 position, "B" is in the A1 position, "C" is in the A2 position, and "D" is in the A3 position. In a first cycle, data "A" is stored in the A3 latch, and fed back as input to the B2 latch. In a second cycle, data "A" is stored in the A2 latch, and data "B" is stored in the A3 latch, and so on. After four clocks, ROW-0 stores the data "D" in the A3 latch, "C" in the A2 latch, "B" in the A1 latch and "A" in the A0 latch. A fifth clock would shift the data with "E" entering the ROW-0 A3 latch and shifting "D" in the A2 latch, "C" in the A1 latch and "B" in A0 latch, the data "A" would then shift out via DOUT[0] to the SCAN_OUT line 160 via the buffer 234. This routing provides shift register movement of data through the selected row providing coverage of the peripheral circuits of the array (addressing, clocking, muxing . . . ) by the scan operation. After eight clocks, ROW-0 stores the data "H" in the A3 latch, "G" in the A2 latch, "F" in the A1 latch, and "E" in the A0 latch, and the data DCBA would be shifted down the scan chain.

Figure 8:
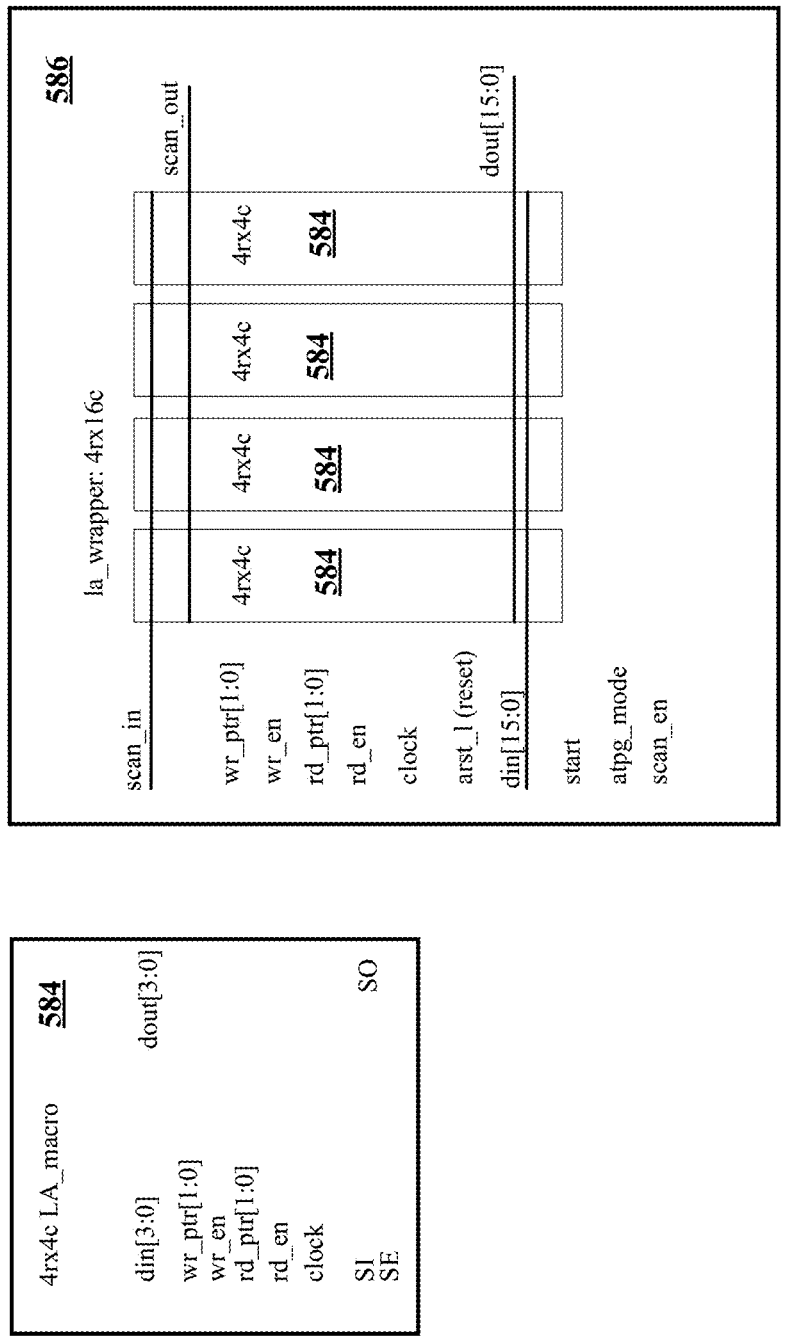
FIG. 8 is an example of a testable Latch Array wrapper and pin-out.

FIG. 8 is a schematic block diagram using a representation of a scannable storage element array 586 comprising four 4×4 scannable latch array macros ("4r×4c"), each of which can be implemented as described with reference to FIG. 2. Concatenating the four 4×4 scannable latch array macros 102 results in a 4 row by a 16 column functional array, usable for example in a functional mode as a 16 bit vector FIFO. The representation includes 4r×4c LA_macro pin out list 584. Note that the terms WR_PTR[1:0] and RD_PTR[1:0] refer to read/write addresses pointers. The term "SI" is serial-in data, "SO" is serial-out or scan-out, "SE" is scan-enable. The schematic block diagram of a Verilog style block (la_wrapper 4r×16c 586) illustrates appending four 4×4 Latch Array macros (4r×4c LA_macro 584) to achieve a 4×16 Latch Array.

In some embodiments, the number of rows can be extended, and the number of columns is fixed for concatenation purposes. Using "mini" 4-column macro instantiations allows amortization of test logic and fixes the column count to "4". Repeating 4 column macros can achieve a desired wrapper width where a byte is two macros, a word is four macros, etc.

The la_wrapper 4r×16c 586 illustrates additional signals, a Test at-speed mode with the signal "start", a test static mode with the signal ATPG_MODE and a broadcast with Scan_En. There is also test static with daisy-chained SCAN_IN. MBIST input logic, staging flops, and Pass/Fail amortize over all 4r×4c macro instances.

In some embodiments, individual placement of each mini 4×4 Latch Array (4r×4c LA_macro 584) can be more efficient in a semiconductor integrated circuit as they are small units connected by scan stitching. Scan stitching between macros can allow for optimal place-and-route flexibility. This eases the problem of placement and routing as it is easier to place smaller chunks of Latch Array memory when building a FIFO or LUT (look-up table) unit. Timing constraints also impose restrictions. MBIST timing can require memory test circuits to be placed in proximity to MBIST controllers. The ability to split Latch Arrays into several macros allows for flexibility to meet timing constraints. Devices having a greater number of memory arrays spread over the same size (or wider) chip area can run into timing problems and additional routing complexities. This macro concept comes to solve that problem.

In some embodiments, Functional Mode implementations of the mini 4×4 Latch Array example (4r×4c LA_macro 584) are sized in row depth and column width for a FIFO operative to load data and pop data off a memory stack using (WR_PTR[1:0]) write addresses pointers and (RD_PTR[1:0]) read addresses pointers. In some embodiments, the system has flags for full, half-full and empty to monitor a FIFO memory stack. In other aspects, a FIFO wrap-around mode allows for circular buffering of data. In other embodiments, implementations of LUTs are used in the Functional Mode.

Figure 9A:
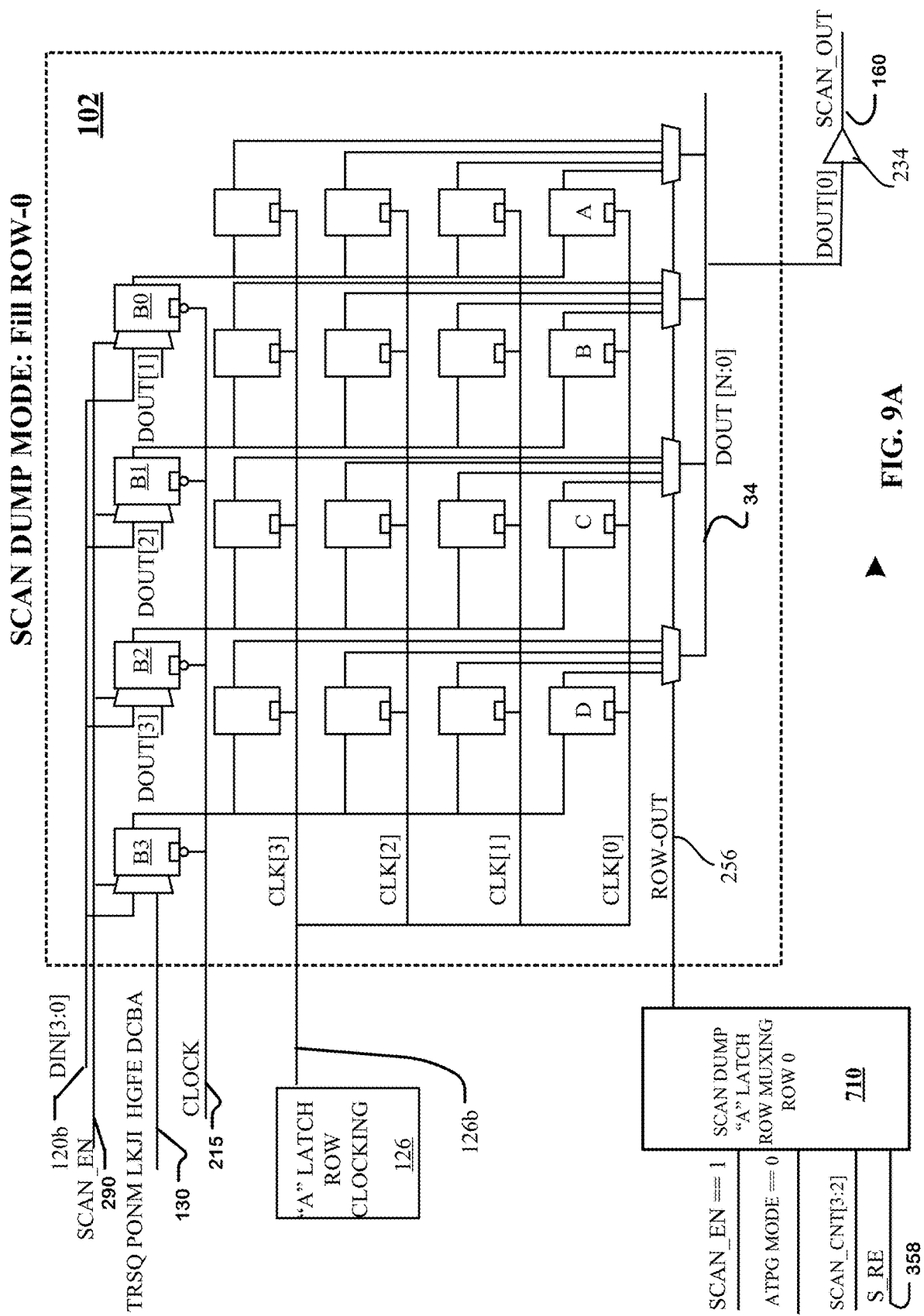
FIG. 9A depicts an example Latch Array loading row "0" with serial-in data operative in Scan Dump mode.

The following is an example pseudo-code method for a 4×4 Scan Dump shown.
Example Pseudo-Code Method for a 4×4 Scan Dump
Step 0: Stop Chip, prepare for Scan Dump
Stop clocks and set ATPG_MODE=0
Step 1: Select Scan Dump Mode
Scan EN=1
Row Counter points to row 0
Step 2: Begin scan unload
4 shift clocks, Row 0 data shifts out scan-out
Column Counter equals 2'b 11 increments Row Counter to 1
4 shift clocks, Row-1 data shifts out scan-out
Column Counter increments Row Counter to 2
4 shift clocks, Row-2 data shifts out scan-out
Column Counter increments Row Counter to 3
4 shift clocks, Row-3 data shifts out scan-out
Column Counter increments Row Counter to 0
Repeat in other macros FIG. 9A depicts a schematic showing an example 4×4 scannable Latch Array 102 loading row "0" with serial-in data, operative in Scan Dump mode. The decoder SCAN DUMP "A" LATCH ROW-MUXING 710 Row-0 mode is active when SCAN_EN equals 1, ATPG MODE 321 equals 0, S_RE 358 is active and SCAN_CNT[3:2] 312 equals 0 to output a ROW_OUT 256 control that enables the row muxes to select Row-0 for the ROW-DATA. An example Scan Dump mode shows an input pattern PONM LKJI HGFE DCBA that is the serial data for the SCAN_IN input on line 130 to the B3 latch. After four clocks, ROW-0 stores the data "D" in the A3 latch, "C" in the A2 latch, "B" in the A1 latch and "A" in the A0 latch. In Scan Dump mode, the data "A" shifts out to the SCAN_OUT line 160 via the buffer 234 only after a wrap-around. This routing provides the shift register movement of data from each of the row outputs across the row-columns using clocking provided by the "A" latch row clocking circuit 126.

Figure 9B:
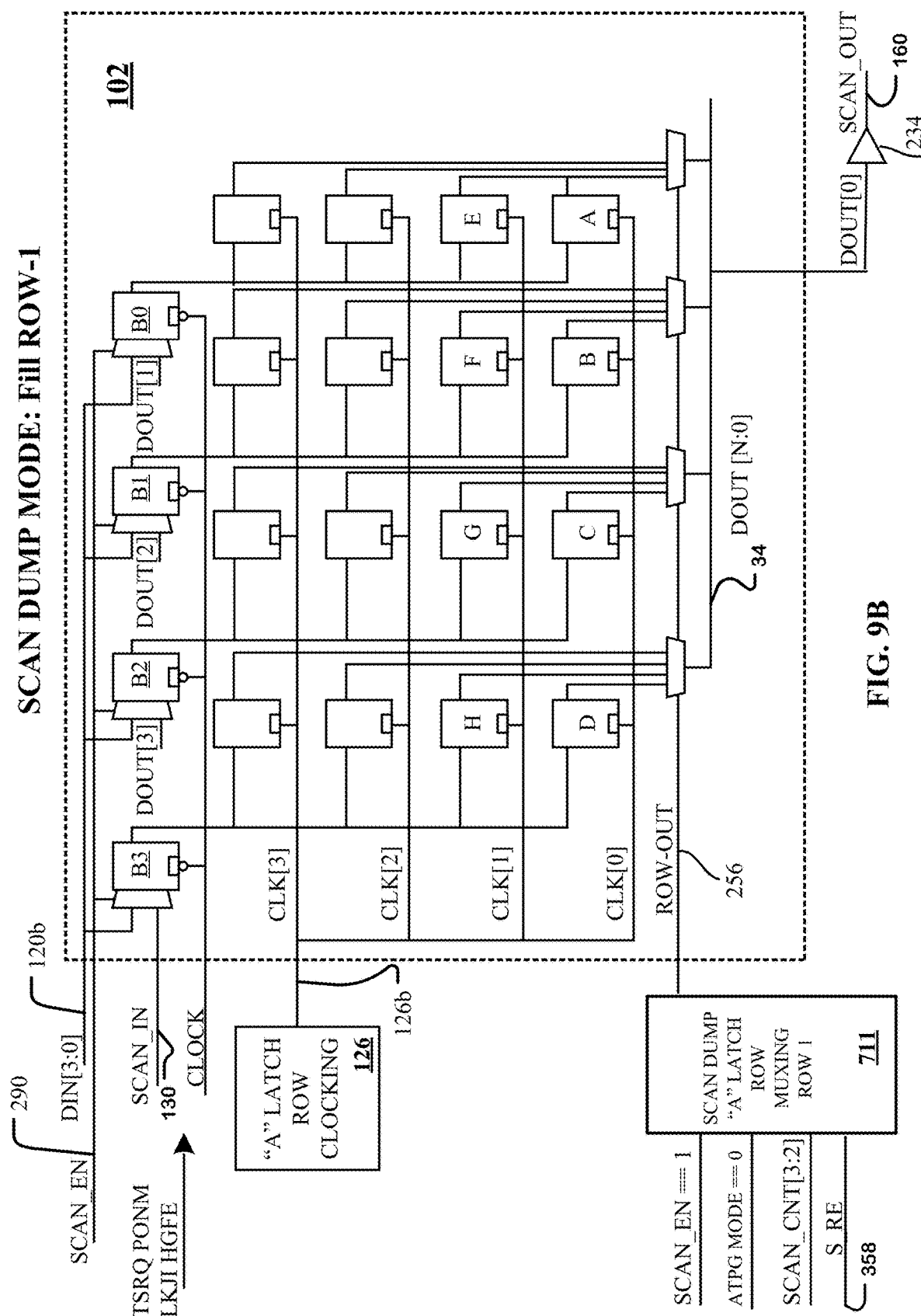
FIG. 9B depicts an example Latch Array loading row "1" with serial-in data operative in Scan Dump mode.

FIG. 9B depicts a schematic showing an example scannable Latch Array 102 loading row "1" with serial-in data, operative in Scan Dump mode with input TSRQ PONM LKJI HGFE as the serial data for the SCAN_IN input to the B3 latch remaining after scanning in DCBA. After eight clocks, ROW 1 stores the data "H" in the A3 latch, "G" in the A2 latch, "F" in the A1 latch, and "E" in the A0 latch. The decoder SCAN DUMP "A" LATCH ROW-MUXING 711 ROW-1 mode is active when SCAN_EN equals 1, ATPG MODE 321 equals 0, S_RE 358 is active and SCAN CNT[3:2] 312 equals 01'b, and outputs a ROW_OUT 256 control that enables the row muxes to select Row-1 for the ROW-DATA[N:0] 245.

Figure 9C:
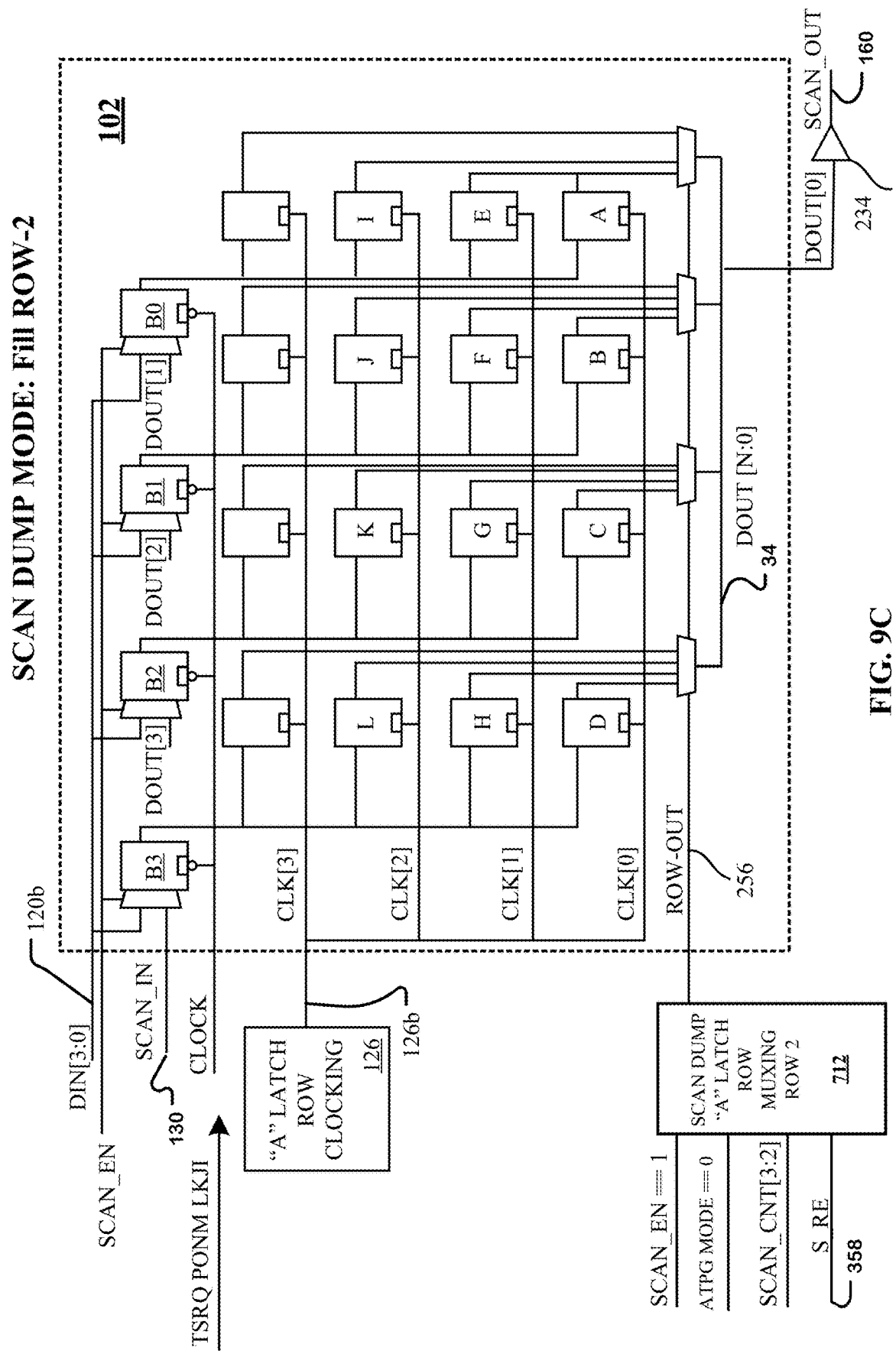
FIG. 9C depicts an example Latch Array loading row "2" with serial-in data operative in Scan Dump mode.

FIG. 9C depicts a schematic showing an example scannable Latch Array 102 loading row "2" with serial-in data, operative in Scan Dump mode. The decoder SCAN DUMP "A" LATCH ROW-MUXING 721 Row-2 mode is active when SCAN_EN equals 1, ATPG MODE 321 equals 0, S_RE 358 is active and SCAN CNT[3:2] 312 equals 10'b and can output a ROW_OUT 256 control to enable the row muxes to select Row-2 of the ROW-DATA[N:0] 245. The example Scan Dump mode shows an input TSRQ PONM LKJI on line 130 as serial data for the SCAN_IN input to the B3 latch. After four clocks, Row-2 stores the data "L" in the A3 latch, "K" in the A2 latch, "J" in the A1 latch and "I" in the A0 latch.

Figure 9D:
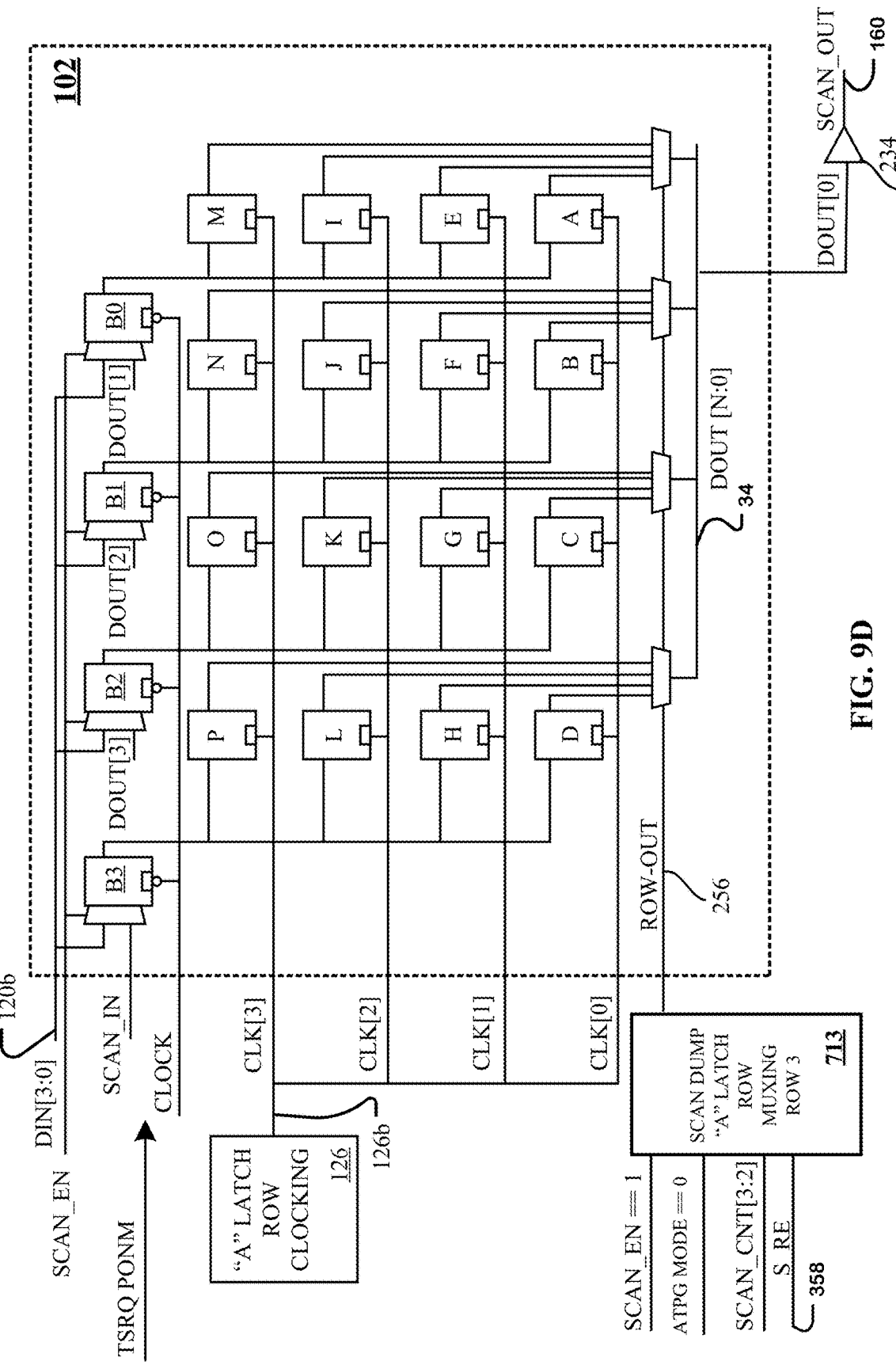
FIG. 9D depicts an example Latch Array loading row "3" with serial-in data operative in Scan Dump mode.

FIG. 9D depicts an example scannable Latch Array 102 loading row "3" with serial-in data operative in Scan Dump mode. The decoder SCAN DUMP "A" LATCH ROW-MUXING 721 mode is active when SCAN_EN equals 1, ATPG MODE 321 equals 0, S_RE 358 is active and SCAN_CNT[3:2] 312 equals 11'b and will output a ROW_OUT 256 control, enabling the row muxes to select row-3 for the ROW-DATA[N:0] 245. The input TSRQ PONM on line 130 is applied as the serial data for the SCAN_IN input to the B3 latch. After four clocks, ROW-3 stores the data "P" in the A3 latch, "O" in the A2 latch, "N" in the A1 latch and "M" in the A0 latch.

Figure 9E:
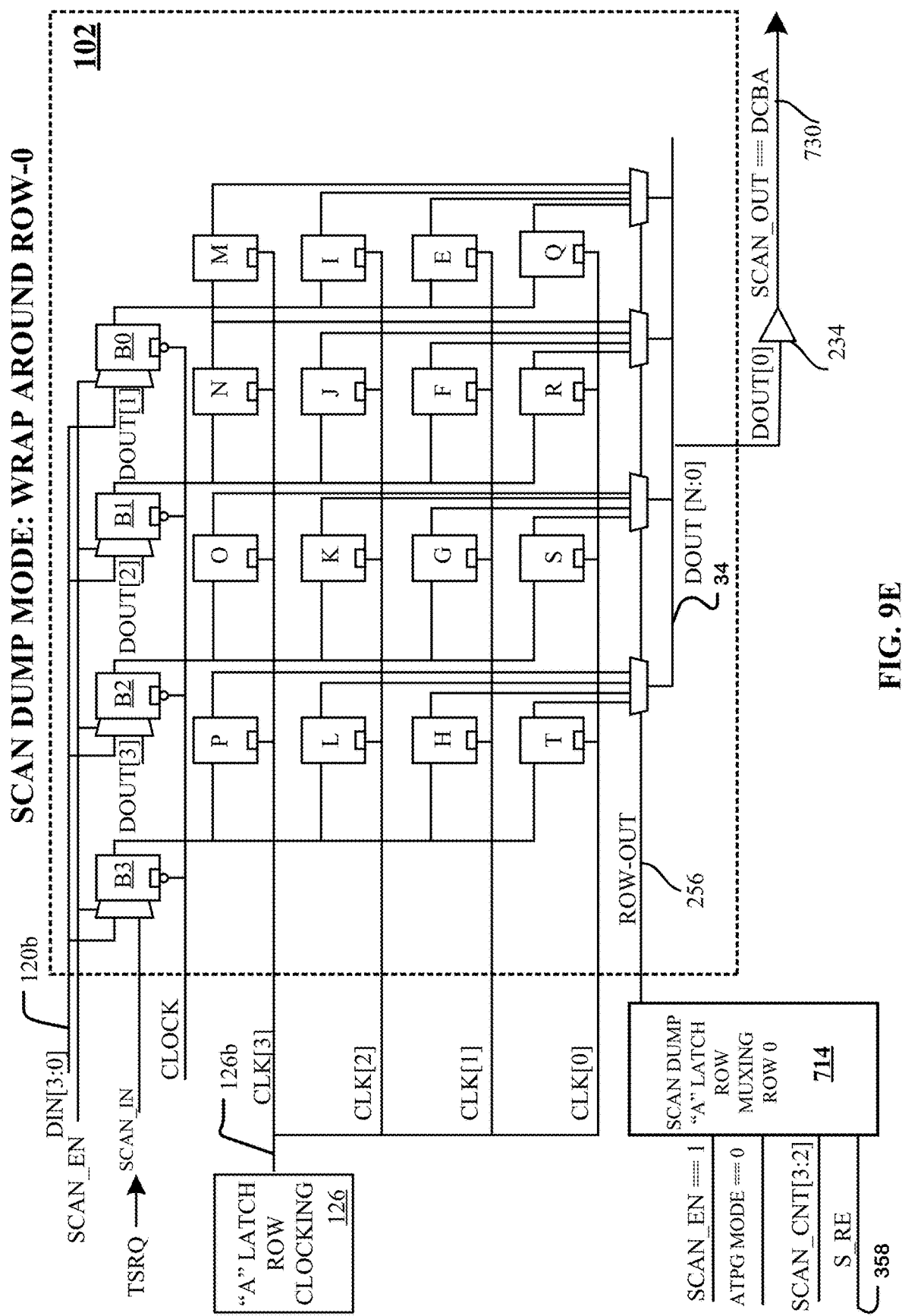
FIG. 9E depicts an example Latch Array loading row "0" with serial-in data in Scan Dump mode and shifting a first row of data to scan-out.

FIG. 9E depicts a schematic showing an example scannable Latch Array 102 wrapping row "0" with serial-in data, operative in Scan Dump mode and shifting a first row of data to SCAN_OUT=DCBA 730. The decoder SCAN DUMP "A" LATCH ROW-MUXING ROW-0 714 mode is active when SCAN_EN equals 1, ATPG MODE 321 equals 0, S_RE 358 is active and SCAN_CNT[3:2] 312 equals 00'b will output a ROW_OUT 256 control to enable the row muxes to select Row-0 for the ROW-DATA[N:0] 245. The input TSRQ on line 130 as the serial data for the SCAN_IN input to the B3 latch. After four clocks, ROW-3 stores the data "T" in the A3 latch, "S" in the A2 latch, "R" in the A1 latch, and "Q" in the A0 latch. Rows one, two, and three were previously filled in FIGS. 9A, 9B and 9C. During wrap-around mode, SCAN_OUT shifts the data DCBA after four clock cycles.

Figure 10A:
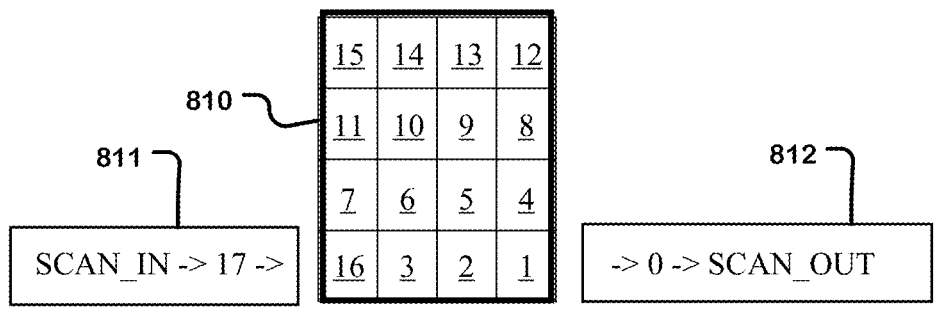
FIG. 10A illustrates a four row, four column Latch Array after 17 scan shift clocks.

FIG. 10A illustrates a four row, four column scannable Latch Array after 17 scan shift clocks 812. The scannable Latch Array 810 first fills with sixteen data values, counting from a Bit 0 value to a Bit 15 value. On the 17th shift clock, upon wrap-around, the row-0 A0 column latch shifts out 812 the Bit 0 value to SCAN-OUT line 160 and shifts in the value of Bit 1. Bit 2 shifts into the row-0 A1 column latch, Bit 3 shifts into the row-0 A2 column latch and a Bit 16 shifts into the row-0 A3 column latch. The next bit value 17 811 is on the SCAN_IN line 130, ready to shift in on the next shift clock.

Figure 10B:
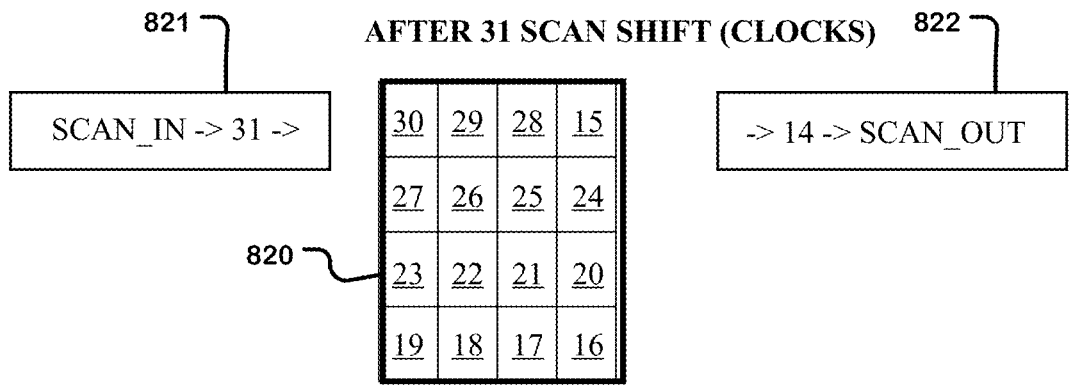
FIG. 10B illustrates a four row, four column Latch Array after 31 scan shift clocks.

FIG. 10B illustrates a four row, four column scannable Latch Array after 31 scan shift clocks. The scannable Latch Array 820 fills with a second set of fifteen new data values, counting from a Bit 16 value to a Bit 30 value. On the 31st shift clock, during wrap-around, the value of Bit 15 shifts into the row-3 A0 column latch and the Bit 14 822 value shifts to SCAN-OUT line 160. Bit 28 shifts into the row-3 A1 column latch, Bit 29 shifts into the row-3 A2 column latch, and Bit 30 shifts into the row-3 A3 column latch. The next Bit value 31 821 is on the SCAN_IN line 130 ready to shift in on the next shift clock.

Figure 10C:
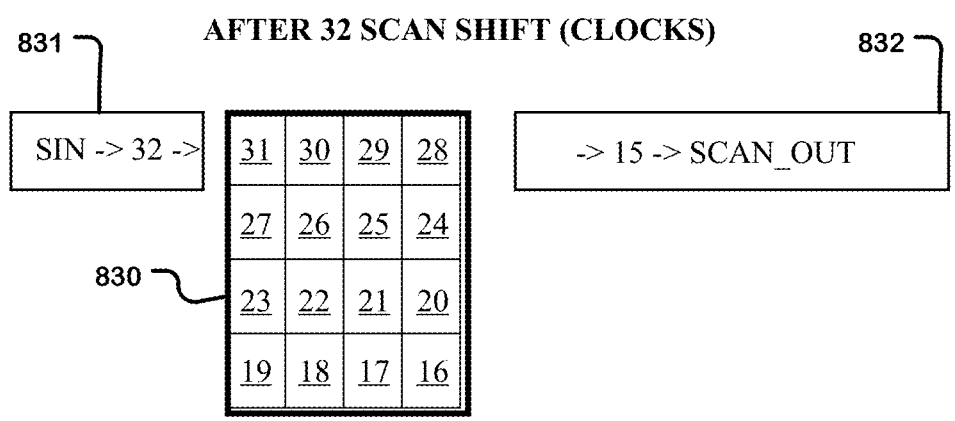
FIG. 10C illustrates a four row, four column Latch Array after 32 scan shift clocks.

FIG. 10C illustrates a four row, four column scannable Latch Array after 32 scan shift clocks. The scannable Latch Array 830 first fills with a second set of fifteen new data values counting from a Bit 16 value to a Bit 31 value as shown in FIG. 11B. On the 32nd clock, during wrap-around, the row-3 A0 column latch shifts out the Bit 15 832 to SCAN-OUT line 160 and Bit 28 shifts into the row-3 A0 column latch. Bit 29 shifts into the row-3 A1 column latch, Bit 30 shifts into the row-3 A2 column latch, and a Bit 32 shifts into the row-3 A3 column latch. The next Bit value 32 831 is on the SCAN_IN line 130 ready to shift in on the next shift clock.

Testability of memory on integrated circuits is improved by connecting storage elements like latches in memory to scan chains and configuring memory for scan dump. The use of latches and similar compact storage elements to form scannable memory can extend the testability of high-density memory circuits on complex integrated circuits operable at high clock speeds. A scannable memory architecture includes an input buffer with active low buffer latches, and an array of active high storage latches, operated in coordination to enable incorporation of the memory into scan chains for ATPG/TT and scan dump testing modes.

What is claimed is:

1. A scannable memory circuit on an integrated circuit having a scan chain, comprising:
    a row counter that increments once every N clock periods, dependent upon a scan enable signal, and resets after reaching a value of M, where both M and N are positive integers greater than 1;
    an input buffer including N buffer latches enabled to load data during a first part of a clock of the clock periods;
    an input selector having N outputs respectively coupled to N inputs of the N buffer latches of the input buffer, the input selector having N first inputs coupled to a first functional data path and N second inputs coupled to a feedback data path, the input selector configured to select between the N first inputs and the N second inputs based on the scan enable signal;
    a clocking circuit, coupled to an output of the row counter and having a functional write address input and M row clock outputs, the clocking circuit configured to drive a selected row clock output of the M row clock outputs to an active state during a second part of the clock period, a selection of the selected row clock output based on the output of the row counter dependent upon the scan enable signal, or the functional write address input dependent on a write enable signal;
    an array of M rows and N columns of storage elements, inputs of each storage element of a column of the N columns of storage elements coupled to an output of a corresponding buffer latch of the N buffer latches of the input buffer, each storage element of a row of the M rows of storage elements coupled to a respective row clock output of the M row clock outputs and enabled to load during an active state of the respective row clock output;
    an output selector, coupled to the output of the row counter and having a functional read address input, M sets of N inputs respectively coupled to outputs of storage elements of the array of M rows and N columns of storage elements, and N outputs coupled to a second functional data path, the output selector configured to select between the M sets of N inputs based on the functional read address input or the output of the row counter dependent upon the scan enable signal;
    a scan input for the scan chain coupled to a first line of the feedback data path, other lines of the feedback data path respectively coupled to different outputs of the N outputs of the output selector, wherein a particular output of the N outputs of the output selector is not coupled to the feedback data path; and
    a scan output of the scan chain coupled to the particular output of the N outputs of the output selector.

2. The scannable memory circuit of claim 1, further comprising:
    a memory built-in self-testing (MBIST) circuit having a MBIST address output and a MBIST data output;
    the input selector having third inputs coupled to the MBIST data output and configured to select the third inputs based on a MBIST enable signal; and the clocking circuit coupled to the MBIST address output and configured to select the selected row clock output based on the MBIST address output dependent upon the MBIST enable signal.

3. The scannable memory circuit of claim 1, wherein the clocking circuit is configured to select a particular row clock output as the selected row clock output based on a test mode enable signal.

4. The scannable memory circuit of claim 1, further comprising:
control circuitry having outputs coupled to the functional write address input and the functional read address input, the control circuitry configured to arrange the array of M rows and N columns of storage elements as a First-In-First-Out (FIFO) buffer, a Look-Up-Table (LUT), or a Least Recently Used (LRU) buffer.

5. The scannable memory circuit of claim 1, wherein the first part of the clock period is between a falling edge and a rising edge of an input clock signal, and the second part of the clock period is between a rising edge and a falling edge of the input clock signal.

6. The scannable memory circuit of claim 1, wherein a buffer latch of the N buffer latches comprises a first transparent latch and a storage element in the array of storage elements coupled to the selected row clock output comprises a second transparent latch, and the first transparent latch and the second transparent latch are configured to act as a master-slave flip-flop in the scan chain.

7. The scannable memory circuit of claim 1, wherein the storage elements in the array of storage elements respectively comprise static random-access memory (SRAM) bit cells.

8. The scannable memory circuit of claim 1, wherein the storage elements in the array of storage elements respectively comprise a single transparent latch.

9. The scannable memory circuit of claim 1, wherein the feedback data path is DIN(N−1:0) and the N outputs of the output bus are DOUT(N−1:0), wherein:
the scan input is coupled to DIN(N−1);
DOUT(N−1:1) are respectively coupled to DIN(N−2:0); and
DOUT(0) is coupled to the scan output.

10. The scannable memory circuit of claim 1, wherein:
the clocking circuit is also coupled to an address output of a test pattern generator and responsive to a mode control input to determine the selected row clock output based on the functional write address input, the output of the row counter, the address output of the test pattern generator or a fixed scan mode row address.

11. A method for scanning an array of storage elements using a scan chain, the array of storage elements arranged into M rows and N columns of storage elements, where both M and N are positive integers greater than 1, the method comprising:
providing a row scan address indicating a current active row of the array of storage elements;
(a) selecting outputs of storage elements of the current active row as an output having N lines, including sending an output bit of scan data from a particular line of the N lines of the output through a scan output of the scan chain;
(b) latching feedback data from a feedback data path having N lines into an input buffer in parallel during a first part of a clock period to ingest an input bit of scan data from a scan input for the scan chain, wherein a first line of the feedback data path is coupled to the scan input and other lines of the feedback data path are respectively coupled to different lines of the N lines of the output, wherein the particular line of the N lines of the output is not coupled to the feedback data path;
(c) latching the feedback data from the input buffer into the storage elements of the current active row in parallel during a second part of the clock period;
(d) repeating (b) and (c) for N−1 additional clock periods;
(e) updating the row scan address to change the current active row of the array of storage elements and resetting the row scan address in response to the updated row scan address equaling reaching a terminal value; and
(f) repeating (a) through (e) at least M times.

12. The method of claim 11, wherein:
updating the row scan address comprises incrementing the row scan address by one;
resetting the row scan address comprises setting the row scan address to zero; and
the terminal value for the row scan address equals M.

13. The method of claim 11, wherein:
the N lines of the feedback data path are DIN(N−1:0);
the N lines of the output are DOUT(N−1:0);
the scan input is coupled to DIN(N−1);
the scan output is coupled to DOUT(0); and
DIN(N−2:0) are respectively coupled to DOUT(N−1:1).

14. The method of claim 11, wherein a bit of scan data flows from the scan input, through each storage element of the array of storage elements, to the scan output, in M×N clock periods.

15. The method of claim 11, wherein at least some of (a) through (f) are performed in response to a scan enable signal being active.

16. The method of claim 15, wherein the current active row is updated only if a scan dump enable signal is active and the current active row is set to a fixed row in response to the scan enable signal being active while the scan dump enable signal is inactive.

17. The method of claim 15, further comprising:
receiving a functional read request with a read row address indicating a read row of the array of storage elements while the scan enable signal is inactive; and
selecting outputs of storage elements of the read row as the output and providing read data from the output to a functional data path.

18. The method of claim 15, further comprising:
receiving a functional write request with a write row address indicating a write row of the array of storage elements while the scan enable signal is inactive;
latching write data from a functional data path into the input buffer in parallel during the first part of the clock period; and
latching the write data from the input buffer into the storage elements of the write row in parallel during a second part of the clock period.

19. The method of claim 15, further comprising:
detecting a mode of operation for the array of storage elements having at least 4 modes of operation including a functional operation mode, a scan mode, a scan dump mode, and a self-test mode, wherein the scan enable signal is active during the scan mode and the scan dump mode;
in response to detecting that the mode of operation is the scan dump mode, performing (a) through (f);
in response to detecting that the mode of operation is the scan mode, setting the current active row to a fixed value and performing at least (a) through (d);

in response to detecting that the mode of operation is the self-test mode, latching test data from a memory built-in self-testing (MBIST) circuit into the input buffer in parallel during the first part of the clock period, using an address from the MBIST circuit to determine a test row of the array of storage elements, and latching the test data from the input buffer into the storage elements of the test row in parallel during a second part of the clock period; and in response to detecting that the mode of operation is the functional operation mode;

in response to a functional read request, selecting outputs of storage elements of a read row selected based on a functional read address as the output and providing read data from the output to a functional data path; and in response to a functional write request, latching write data from a functional data path into the input buffer in parallel during the first part of the clock period, and latching the write data from the input buffer into the storage elements of a write row in parallel during a second part of the clock period, wherein the write row is selected based on a functional write address.

20. The method of claim 11, wherein the first part of the clock period is between a falling edge and a rising edge of an input clock signal, and the second part of the clock period is between a rising edge and a falling edge of the input clock signal.

\* \* \* \* \*